(12) United States Patent
Nakao et al.

(10) Patent No.: US 9,620,366 B2
(45) Date of Patent: Apr. 11, 2017

(54) METHOD FOR MANUFACTURING SEMICONDUCTOR DEVICE

(71) Applicant: Kabushiki Kaisha Toshiba, Minato-ku (JP)

(72) Inventors: Shinichi Nakao, Yokkaichi (JP); Shunsuke Ochiai, Yokkaichi (JP); Yusuke Oshiki, Kuwana (JP); Kei Watanabe, Yokkaichi (JP); Mitsuhiro Omura, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/179,387

(22) Filed: Jun. 10, 2016

(65) Prior Publication Data

US 2016/0365249 A1    Dec. 15, 2016

(30) Foreign Application Priority Data

Jun. 12, 2015   (JP) .................................. 2015-119821

(51) Int. Cl.

| *H01L 21/336* | (2006.01) |
| *H01L 21/033* | (2006.01) |
| *H01L 27/1157* | (2017.01) |
| *H01L 27/11582* | (2017.01) |
| *H01L 21/768* | (2006.01) |

(Continued)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/76816* (2013.01); *H01L 21/76877* (2013.01); *H01L 23/528* (2013.01); *H01L 23/5226* (2013.01); *H01L 27/1157* (2013.01); *H01L 27/11582* (2013.01)

(58) Field of Classification Search
CPC ........... H01L 21/0338; H01L 21/76877; H01L 21/02642; H01L 21/3088; H01L 2224/27916; H01L 23/528; H01L 27/1157; H01L 27/11582
USPC .................................................. 438/257–267
See application file for complete search history.

(56) References Cited

U.S. PATENT DOCUMENTS

| 6,287,975 B1 | 9/2001 | DeOrnellas et al. |
| 2005/0009350 A1* | 1/2005 | Vogt .................. H01L 21/32139 438/689 |
| 2011/0183497 A1 | 7/2011 | Sakurai et al. |

(Continued)

FOREIGN PATENT DOCUMENTS

| JP | 2000-150463 | 5/2000 |
| JP | 2007-35679 | 2/2007 |
| JP | 2013-197419 | 9/2013 |

*Primary Examiner* — Brook Kebede
(74) *Attorney, Agent, or Firm* — Oblon, McClelland, Maier & Neustadt, L.L.P.

(57) ABSTRACT

According to one embodiment, a method for manufacturing a semiconductor device includes forming a mask layer on a layer to be etched. The mask layer contains at least one type of a metal, boron, and carbon. The metal is selected from a group including tungsten, tantalum, zirconium, hafnium, molybdenum, niobium, ruthenium, osmium, rhenium and iridium. A composition ratio of the metal is higher than a composition ratio of the boron and a composition ratio of the carbon. The method includes making a hole or a slit in the layer to be etched by performing a dry etching to the layer to be etched using the mask layer being patterned.

17 Claims, 21 Drawing Sheets

(51) Int. Cl.
*H01L 23/528* (2006.01)
*H01L 23/522* (2006.01)

(56) References Cited

U.S. PATENT DOCUMENTS

| | | |
|---|---|---|
| 2012/0068347 A1 | 3/2012 | Isobayashi et al. |
| 2012/0244712 A1 | 9/2012 | Tsubata et al. |
| 2014/0264758 A1* | 9/2014 | Huisinga ........... H01L 21/02079 257/618 |

* cited by examiner

METHOD FOR MANUFACTURING SEMICONDUCTOR DEVICE

CROSS-REFERENCE TO RELATED APPLICATION

This application is based upon and claims the benefit of priority from Japanese Patent Application No.2015-119821, filed on Jun. 12, 2015; the entire contents of which are incorporated herein by reference.

FIELD

Embodiments described herein relate generally to a method for manufacturing a semiconductor device.

BACKGROUND

For example, a technology for making a hole in a stacked body in which different types of materials are stacked repeatedly is required in a method for manufacturing a memory cell array having a three dimensional structure. As increasing a number of stacks for increasing bit density, a thickness of the stacked body increases, then, it is required to make a hole having a high aspect ratio. Because etching amount for mask increases in the etching for making a hole having a high aspect ratio, a mask configuration easily degrades. Degradation of the mask configuration affects configuration and size of the hole made in the stacked body.

DETAILED DESCRIPTION

Figure 1:
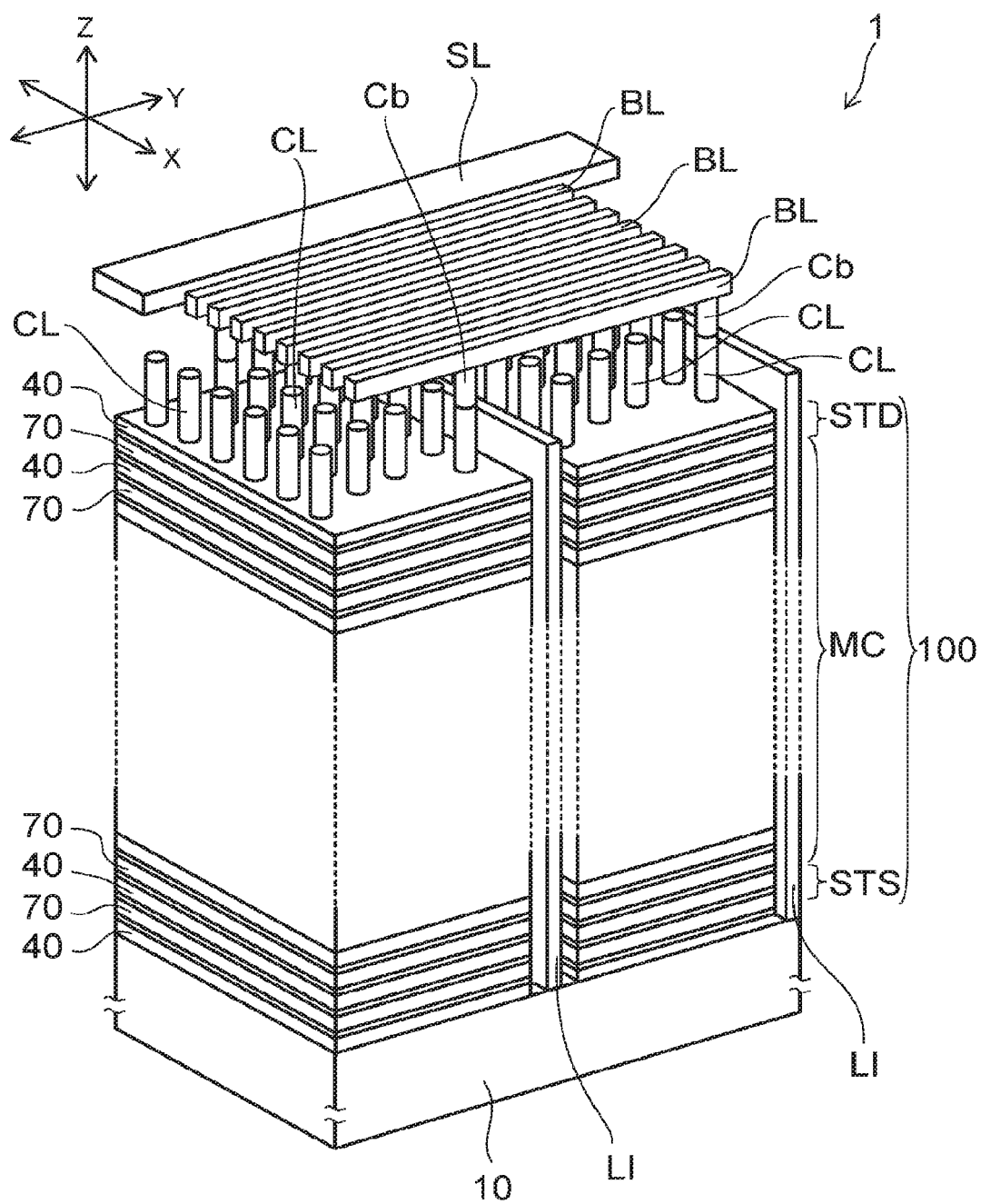
FIG. 1 is a schematic perspective view of a semiconductor device of an embodiment.

According to one embodiment, a method for manufacturing a semiconductor device includes forming a mask layer on a layer to be etched. The mask layer contains at least one type of a metal, boron, and carbon. The metal is selected from a group including tungsten, tantalum, zirconium, hafnium, molybdenum, niobium, ruthenium, osmium, rhenium and iridium. A composition ratio of the metal is higher than a composition ratio of the boron and a composition ratio of the carbon. The method includes patterning the mask layer. The method includes making a hole or a slit in the layer to be etched by performing a dry etching to the layer to be etched using the mask layer being patterned.

Embodiments will now be described with reference to the drawings. The same components are marked with the same reference numerals in the drawings.

The semiconductor device of the embodiment is a semiconductor memory device. FIG. 1 is a schematic perspective view of a memory cell array 1 in the semiconductor memory device of the embodiment.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction).

The memory cell array 1 includes the substrate 10, a stacked body 100 provided on the major surface of the substrate 10, multiple columnar portions CL, a conductive material LI, and upper layer interconnects provided above the stacked body 100. For example, bit lines BL and a source line SL are shown as the upper layer interconnects in FIG. 1.

The columnar portions CL are formed in circular columnar or elliptical columnar configurations extending in the stacking direction (the Z-direction) through the stacked body 100. The conductive material LI spreads in the X-direction and the stacking direction of the stacked body 100 (the Z-direction) between the upper layer interconnect and the substrate 10, and divide the stacked body 100 in the Y-direction.

The multiple columnar portions CL have, for example, a staggered arrangement. Or, the multiple columnar portions CL may have a square lattice arrangement along the X-direction and the Y-direction.

The multiple bit lines (e.g., metal film) BL are provided above the stacked body 100. The multiple bit lines BL are separated from each other in the X-direction, and each of the bit lines extends in the Y-direction.

The upper end of the columnar portion CL is connected to the bit line BL via a contact portion Cb. The multiple columnar portions CL, each of which is selected from each of regions (blocks) divided in the Y-direction by the conductive material LI, are connected to one common bit line BL.

Figure 2:
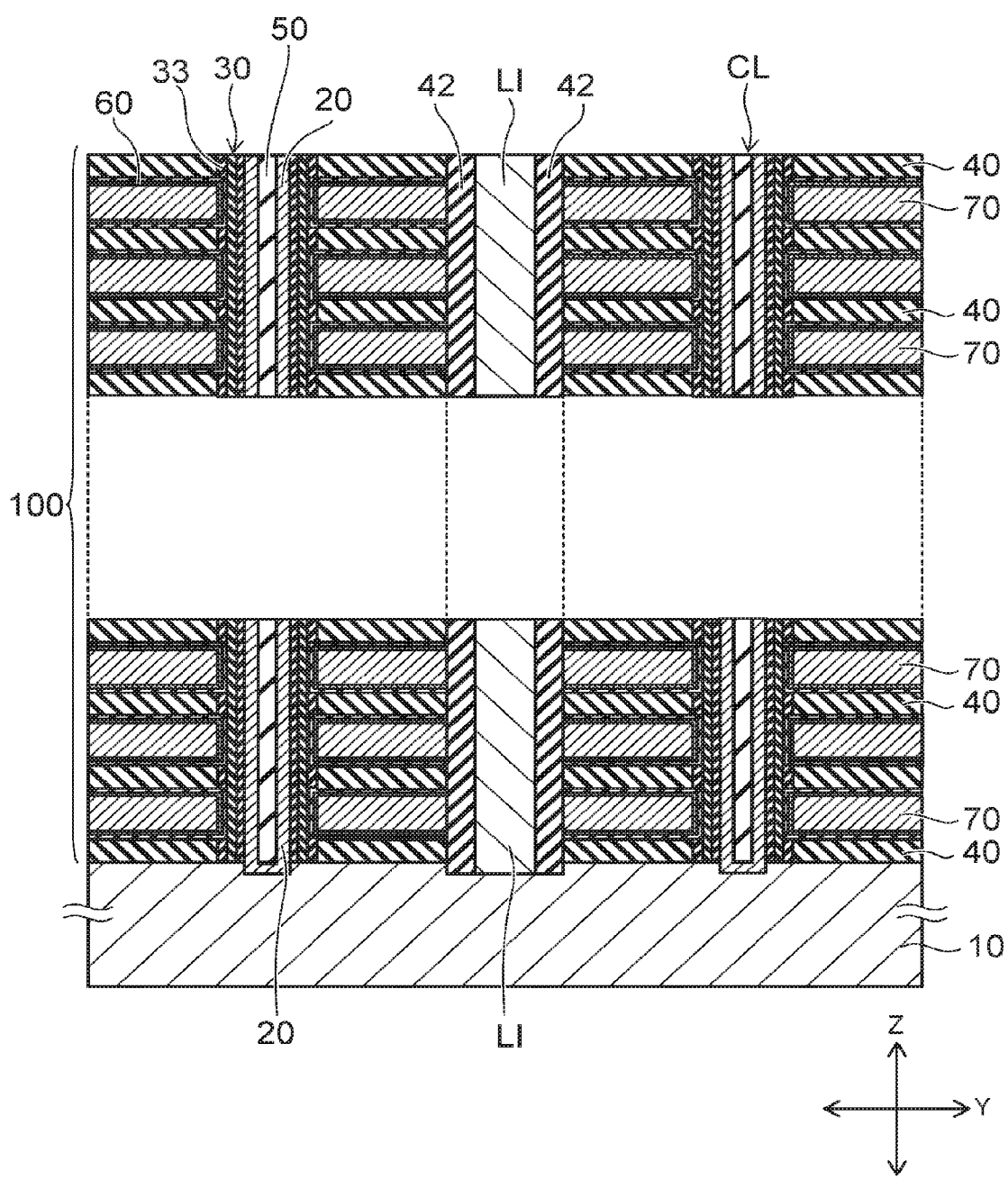
FIG. 2 is a schematic cross-sectional view of the semiconductor device of the embodiment.

FIG. 2 is a schematic cross-sectional view of the stacked body 100, the columnar portions CL, and the conductive material LI. FIG. 2 shows a cross-section parallel to the Y-Z plane in FIG. 1.

The stacked body 100 includes multiple conductive layers 70 and multiple insulating layers 40 stacked on the major surface of the substrate 10. The multiple conductive layers 70 are stacked in the Z-direction at a predetermined period with the insulating layer 40 interposed.

The conductive layer 70 is a metal layer containing at least one of tungsten (W) and molybdenum (Mo). The conductive layer 70 is a tungsten layer containing tungsten as a major component, or a molybdenum layer containing molybdenum as a major component. The insulating layer 40 contains, for example silicon oxide ($SiO_2$) as a major component.

Figure 3:
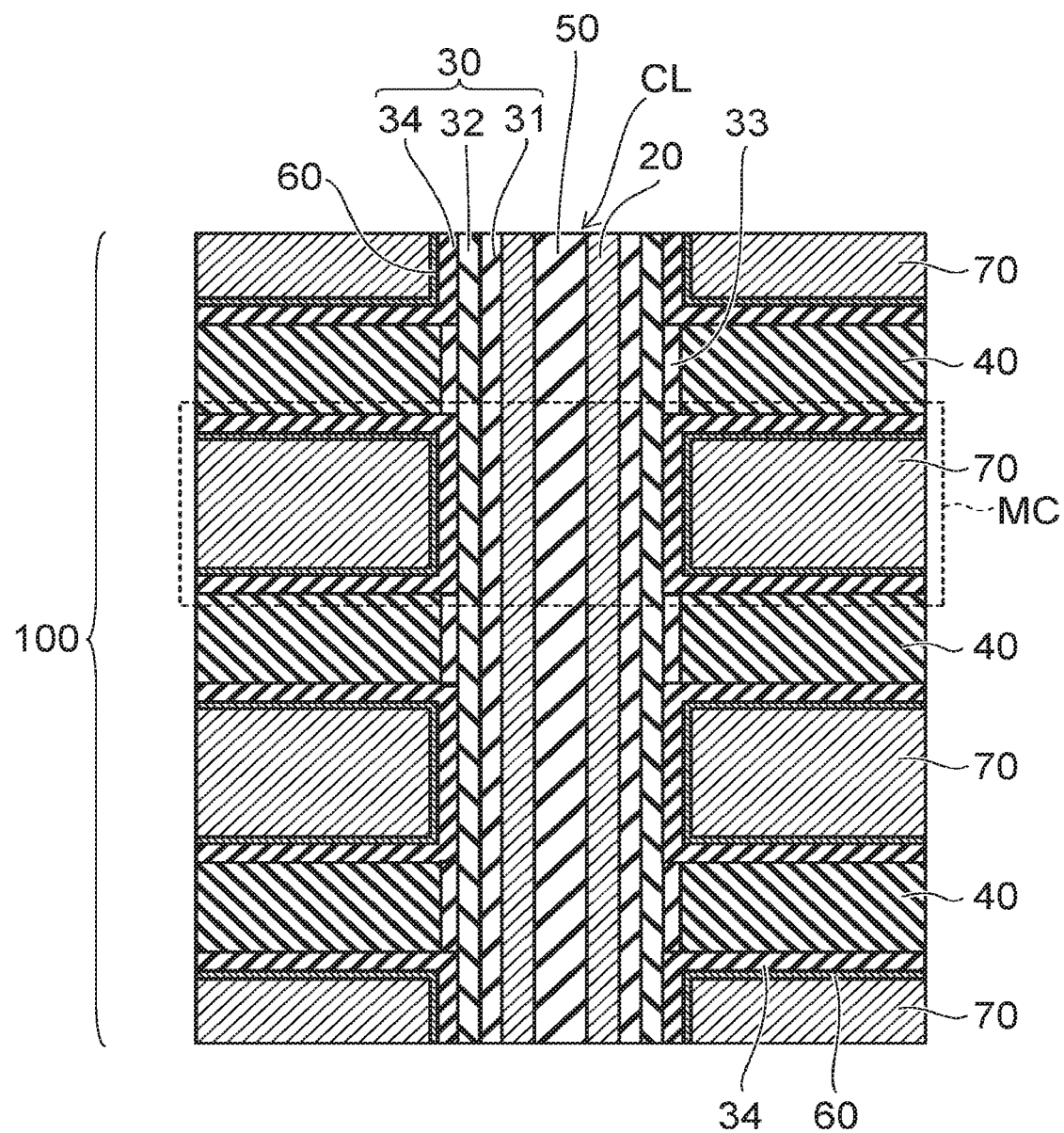
FIG. 3 is an enlarged cross-sectional view of one portion of FIG. 2.

FIG. 3 is an enlarged cross-sectional view of one portion of FIG. 2.

The columnar portion CL includes a memory film 30, a semiconductor film 20, and an insulative core film 50. The semiconductor film 20 extends in a pipe-like configuration in the stacking direction (the Z-direction) through the stacked body 100. The memory film 30 is provided between the conductive layer 70 and the semiconductor film 20, and surrounds the semiconductor film 20 from an outer circumferential side. The core film 50 is provided on the inner side of the semiconductor film 20 having the pipe-like configuration.

The upper end of the semiconductor film 20 is electrically connected to the bit line BL via the contact portion Cb shown in FIG. 1.

The memory film 30 includes a tunneling insulating film 31 as a first insulating film, a charge storage film 32, and a blocking insulating film 34 as a second insulating film. The charge storage film 32, the tunneling insulating film 31, and the semiconductor film 20 extend to be continuous in the stacking direction of the stacked body 100. The blocking insulating film 34, the charge storage film 32, and the tunneling insulating film are provided between the conductive layer 70 and the semiconductor film 20 in order from the conductive layer 70 side.

The tunneling insulating film 31 contacts the semiconductor film 20. The charge storage film 32 is provided between the blocking insulating film 34 and the tunneling insulating film 31.

The semiconductor film 20, the memory film 30, and the conductive layer 70 are included in a memory cell MC. The memory cell MC has a vertical transistor structure in which the conductive layer 70 surrounds the periphery of the semiconductor film 20 with the memory film 30 interposed.

In the memory cell MC having the vertical transistor structure, the semiconductor film 20 functions as a channel; and the conductive layer 70 functions as a control gate (control electrode). The charge storage film 32 functions as a data storage layer that stores charge injected from the semiconductor film 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film.

The tunneling insulating film 31 works as a potential barrier when charge is injected from the semiconductor film 20 into the charge storage film 32, or when the charge stored in the charge storage film 32 is released into the semiconductor film 20. The tunneling insulating film 31 includes, for example, a silicon oxide film.

The blocking insulating film 34 prevents the charge stored in the charge storage film 32 from being released into the conductive layer 70. The blocking insulating film 34 includes, for example, a silicon oxide film. The blocking insulating film 34 prevents back-tunneling of electrons from the conductive layer 70 in an erasing operation.

The blocking insulating film 34 is provided also between the conductive layer 70 and the insulating layer 40. The blocking insulating film 34 contacts the lower surface of the insulating layer 40 immediately above the conductive layer 70, and the upper surface of the insulating layer 40 immediately below the conductive layer 70.

A blocking insulating film 34 between the conductive layer 70 and the charge storage film 32, and a blocking insulating film 34 between the conductive layer 70 and the insulating layer 40 are provided to be continuous as one body.

A nitride film 60 is provided between the conductive layer 70 and the blocking insulating film 34. The nitride film 60 includes, for example, a titanium nitride film. The nitride film 60 increases adhesion between the conductive layer 70 and the blocking insulating film 34. Also, the nitride film 60 prevents a diffusion of metal contained in the conductive layer 70 into the blocking insulating film 34 side. The nitride film 60 contacts the conductive layer 70 and the blocking insulating film 34. The nitride film 60 is provided continuously along the upper surface, lower surface and side surface of the conductive layer The nitride film 60 and the blocking insulating film 34 are not provided between the side surface of the insulating layer 40 and the charge storage film 32. A cover insulating film 33 is provided between the side surface of the insulating layer 40 and the charge storage film 32. The cover insulating film 33 is, for example, a silicon oxide film.

As shown in FIG. 1, a drain-side selection transistor STD is provided at the upper end portion of the columnar portion CL, and a source-side selection transistor STS is provided at the lower end portion of the columnar portion CL. For example, the conductive layer 70 of the lowermost layer among the multiple conductive layers 70 functions as a control gate (control electrode) of the source-side selection transistor STS. For example, the conductive layer 70 of the uppermost layer among the multiple conductive layers 70 functions as a control gate (control electrode) of the drain-side selection transistor STD. Similarly to the memory cell MC, the drain-side selection transistor STD and the source-side selection transistor STS are the vertical transistors in which current flows in the stacking direction of the stacked body 100 (the Z direction).

The memory cells MC are provided between the drain-side selection transistor STD and the source-side selection transistor STS. The memory cells MC, the drain-side selection transistor STD, and the source-side selection transistor STS are connected in series via the semiconductor film 20, and are included in one memory string. For example, the memory strings have a staggered arrangement in a surface direction parallel to the X-Y plane; and the memory cells MC are provided three-dimensionally in the X-direction, the Y-direction, and the Z-direction.

As shown in FIG. 2, an insulating film 42 is provided on both side walls of the conductive material LI dividing the stacked body 100 in the Y-direction. The insulating film 42 is provided between the stacked body 100 and the conductive material LI. The insulating film 42 is not shown in FIG. 1.

The conductive material LI is a metal material containing, for example, tungsten as a main component. The upper end of the conductive material LI is connected to the source layer SL provided above the stacked body 100 shown in FIG. 1. As shown in FIG. 2, the lower end of the conductive material LI contacts the substrate 10. Also, the lower end of the semiconductor film 20 contacts the substrate 10. The substrate 10 is, for example, a conductive silicon substrate doped with an impurity. Accordingly, the lower end of the semiconductor film 20 is electrically connected to the source layer SL via the substrate 10 and the conductive material LI.

The films included in the columnar portion CL are formed inside the memory hole made in the stacked body 100. The memory hole is, for example, made by reactive ion etching (RIE). For increasing a storage capacity, it is required to form the memory cells in high density. For example, a diameter of the memory hole is required to be 100 nm or less, and a stacked number of the conductive layers 70 is required to be about several tens, and thus, the memory hole is to be a fine hole having extremely high aspect ratio.

Figure 21:
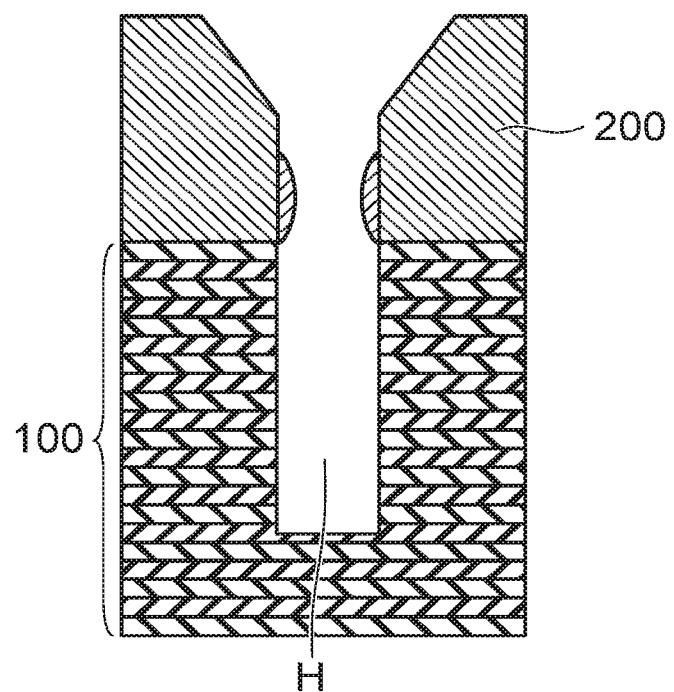
FIG. 21 is a schematic cross-sectional view showing one example of a degradation in a mask configuration.

As shown in FIG. 21, as etching for a layer 100 to be etched progresses, a corner portion (shoulder portion) adjacent to an opening portion of a mask layer 200 is sputtered by ion and is easily to be a tapered shape, generally in the RIE technology. Also, the sputtered mask material may be deposited on a side surface of the opening portion.

As increasing the thickness of the layer 100 to be etched due to further increase of the capacity, the aspect ratio of a hole H increases, and it is expected that making a hole having an appropriated configuration will be more difficult.

A method for making the memory hole will now be described with reference to FIG. 4 to FIG. 10.

Figure 4:
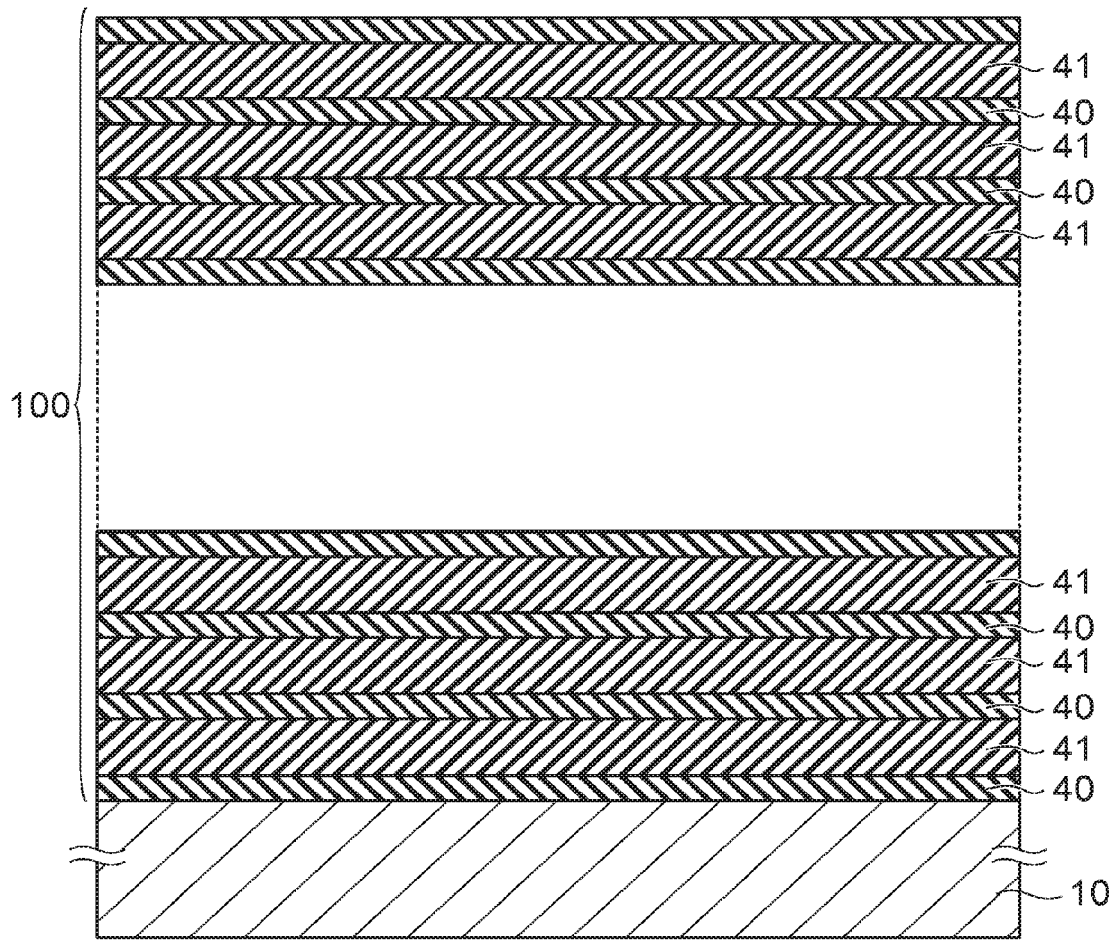
FIGS. 4 to 20 are schematic cross-sectional views showing a method for manufacturing the semiconductor device of the embodiment.

As shown in FIG. 4, the stacked body 100 is formed on the substrate 10 as a layer to be etched. The substrate 10 is, for example, a monocrystalline silicon substrate.

The insulating layer (a second layer) 40 is formed on a major surface of the substrate 10; and a sacrificial layer (a first layer) 41 is formed on the insulating layer 40. The sacrificial layer 41 is a layer of a different type of material from the insulating layer 40. The processes of repeatedly stacking the insulating layer 40 and the sacrificial layer 41 are repeated multiple times, and the stacked body 100 including a plurality of insulating layers 40 and a plurality of sacrificial layers 41 are formed on the substrate 10.

For example, a silicon oxide film ($SiO_2$ film) is formed as the insulating layer 40 by CVD (Chemical Vapor Deposition), and a silicon nitride film (SiN film) is formed as the sacrificial layer 41 by CVD. The sacrificial layer 41 is removed in a subsequent process, and the blocking insulating film 34, a nitride film 60 and the conductive layer 70 are formed in the gap (space) where the sacrificial layer 41 was removed.

The sacrificial layer 41 may be a layer having high etching selectivity with respect to the insulating layer 40 and is not limited to a silicon nitride film. For Example, a polycrystalline silicon film may be formed as the sacrificial layer 41 by CVD.

Figure 5:
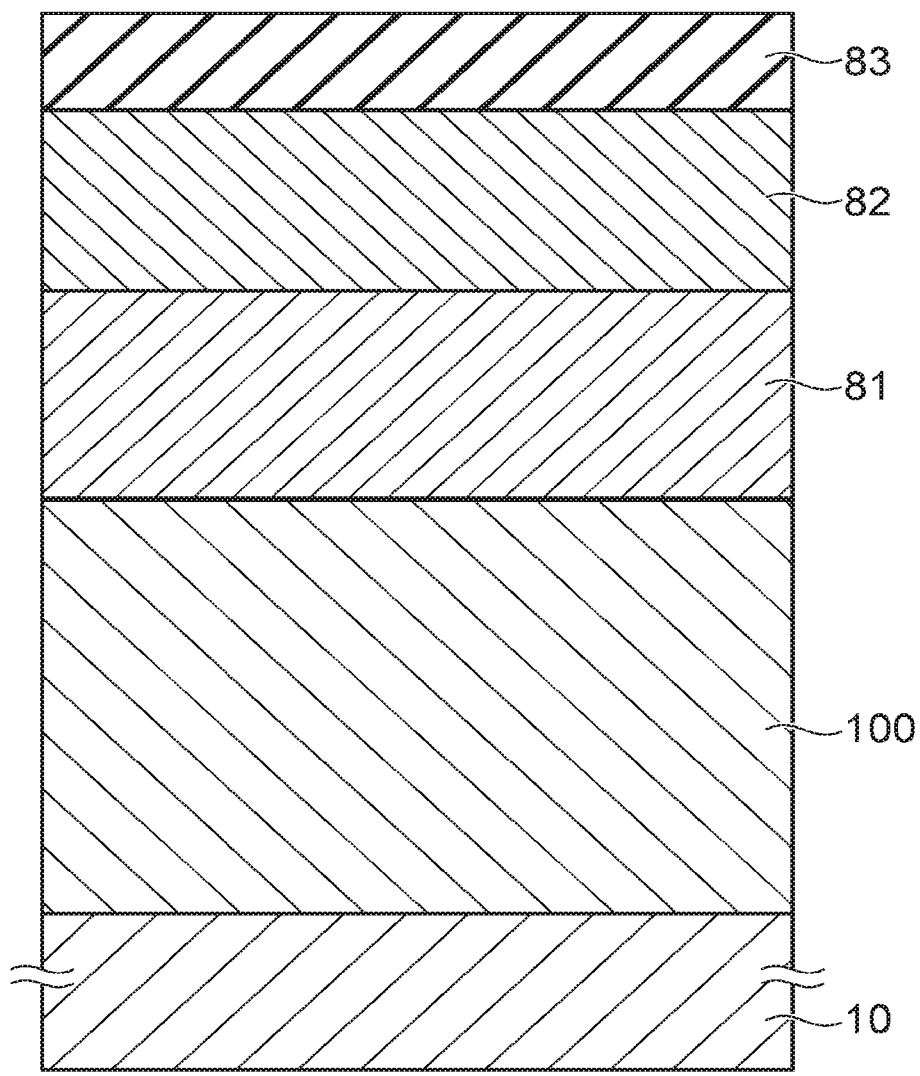

As shown in FIG. 5, a mask layer 81 is formed on the stacked body 100. A first intermediate layer 82 is formed on the mask layer 81. A resist 83 is formed on the first intermediate layer 82.

The mask layer 81 is a layer of a different type of material from the stacked body 100 (the insulating layer 40 and the sacrificial layer 41). The mask layer 81 contains tungsten (W), boron (B) and carbon (C). A composition ratio of tungsten is higher than the composition ratio of boron and the composition ratio of carbon in the mask layer 81. The composition ratio here is represented by an atomic percent.

The composition ratio of tungsten is higher than 50 atomic percent. For example, the composition ratio of tungsten is 60 atomic percent, the composition ratio of boron is 20 atomic percent, and the composition ratio of carbon is 20 atomic percent.

The mask layer 81 is formed, for example, by plasma CVD (Chemical Vapor Deposition). For example, inorganic based gas such as tungsten hexafluoride ($WF_6$), tungsten hexachloride ($WCl_6$), and tungsten hexacarbonyl ($W(CO)_6$) is used as a tungsten source gas in the CVD.

Or, an organic based gas can be used as a tungsten source gas. For example, Bis (cyclopentadienyl) tungsten(IV) dihydride ($C_{10}H_{12}W$), Cyclopentadienyl tungsten (II) tricarbonyl hydride ($C_8H_6O_3W$), Bis (tert-butylimino) bis (tert-butylamino) tungsten (($C_4H_9NH)_2W(C_4H_9N)_2$), Tetracarbonyl (1,5-cyclooctadiene) tungsten (0) ($C_{12}H_{12}O_4W$), Triamminetungsten (IV) tricarbonyl (($NH_3)_3W(CO)_3$), Tungsten (0) pentacarbonyl-N-pentylisonitrile (($CO)_5WCN(CH_2)_4CH_3$), Bis (isopropylcyclopentadienyl) tungsten (IV) dihydride (($C_5H_4CH(CH_3)_2)_2WH_2$), Bis (tert-butylimino) bis(dimethylamino) tungsten (VI)((($CH_3)_3CN)_2W(N(CH_3)_2)_2$), Bis (butylcyclopentadienyl) tungsten(IV) diiodide ($C_{18}H_{26}I_2W$), or Bis (cyclopentadienyl) tungsten (IV) dichloride ($C_{10}H_{10}Cl_2W$) can be used as the organic based gas.

For example, diborane ($B_2H_6$), boron trifluoride ($BF_3$), or pentaborane ($B_5H_9$) can be used as a boron source gas in CVD for forming the mask layer 81.

For example, propylene ($C_3H_6$), acetylene ($C_2H_2$), ethylene ($C_2H_4$), or methane ($CH_4$) can be used as a carbon source gas in CVD for forming the mask layer 81.

The first intermediate layer 82 is a layer of different types of materials from the mask layer 81. The first intermediate layer 82 is, for example, an amorphous carbon layer containing amorphous carbon as a main component, a boron carbide layer containing boron carbide (BC) as a main component, a boron nitride layer containing boron nitride (BN) as a main component, a silicon oxide layer containing silicon oxide (SiO) as a main component, a silicon nitride layer containing silicon nitride (SiN) as a main component, or an amorphous silicon layer containing amorphous silicon as a main component. The first intermediate layer 82 is formed, for example, by plasma CVD.

Figure 6:
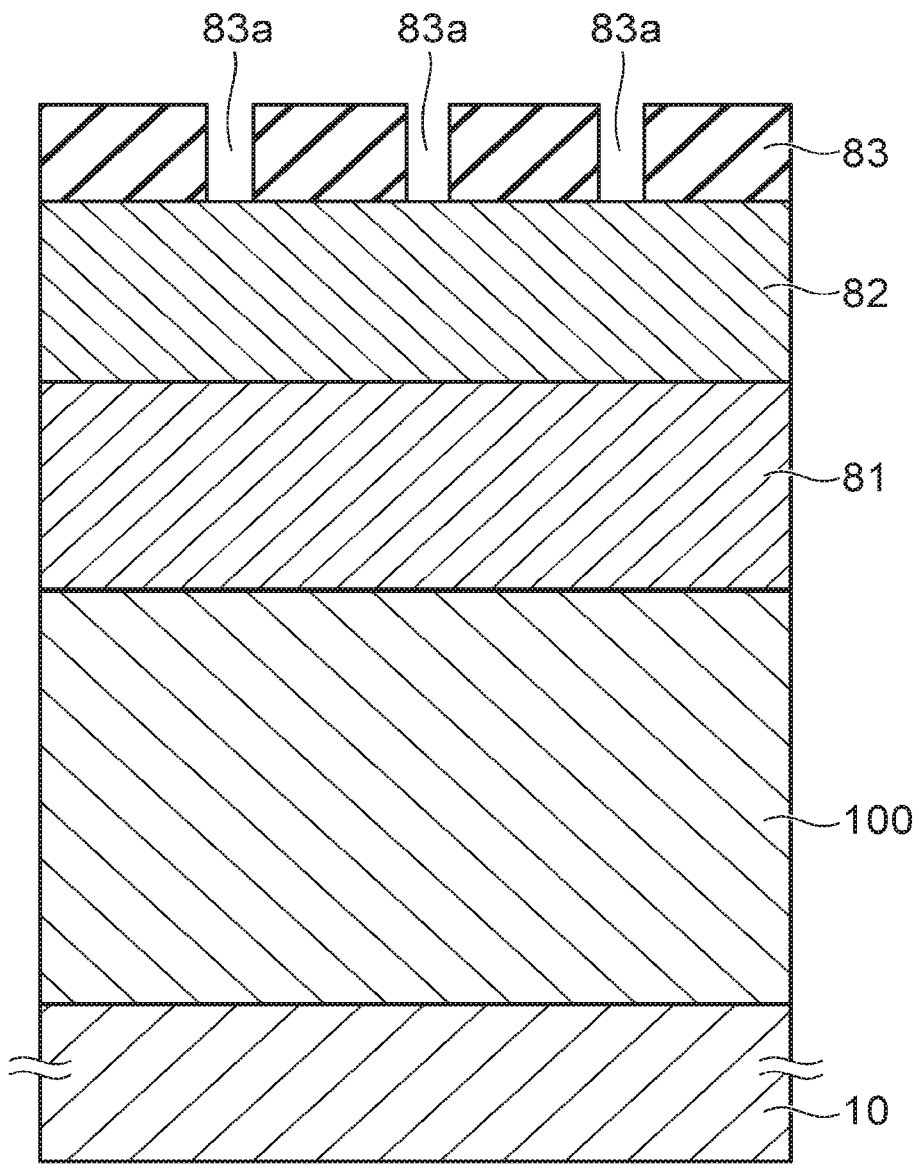

A resist 83 is formed, for example, by a coating method. As shown in FIG. 6, multiple hoes 83a are made in the resist 83 by exposing and developing to the resist 83.

Figure 7:
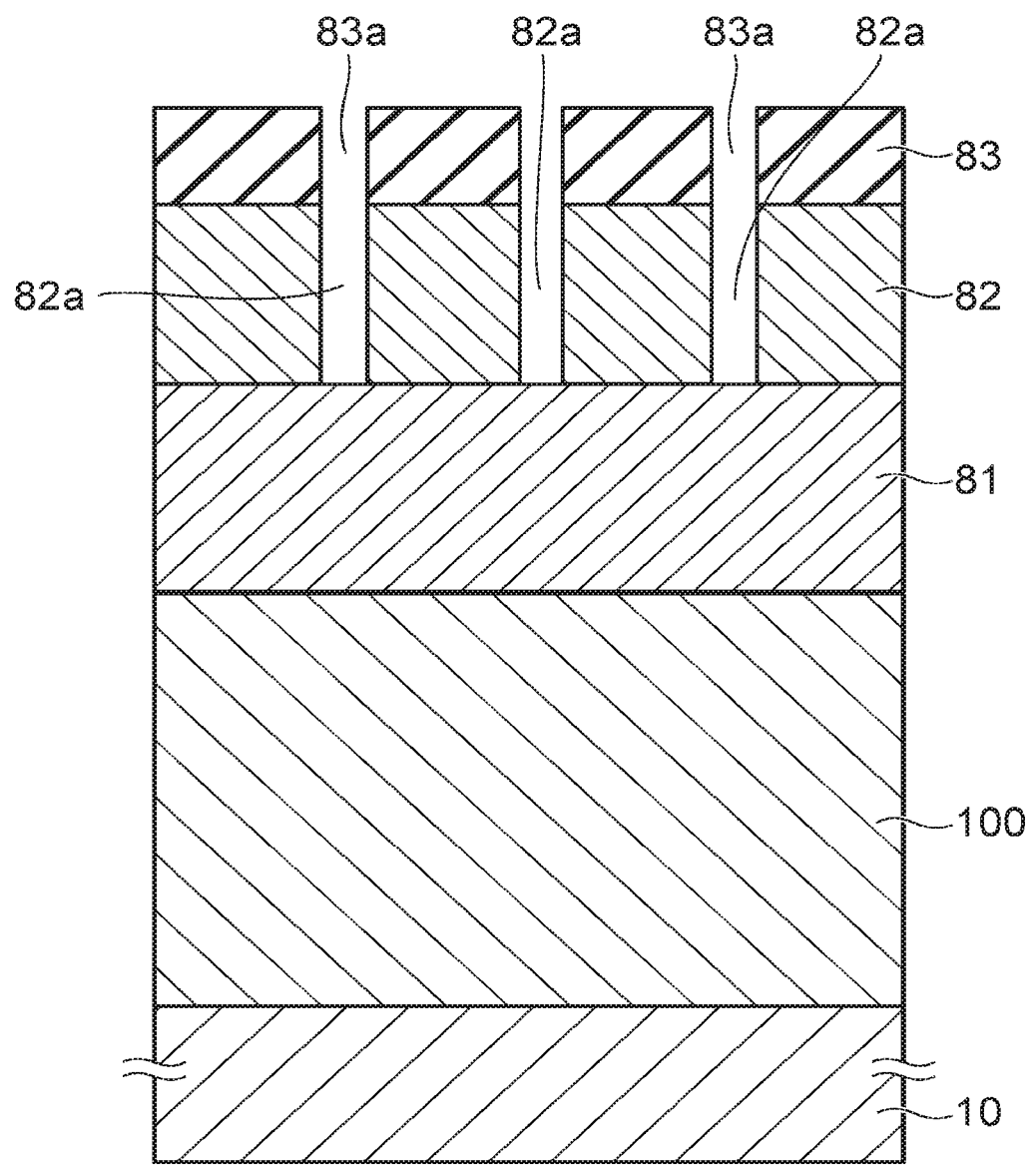

As shown in FIG. 7, the first intermediate layer 82 is patterned by RIE using the resist 83 having the holes 83a as a mask. Multiple holes 82a are made in the first intermediate layer 82. In case where the first intermediate layer 82 is a silicon oxide layer, the first intermediate layer 82 is etched using a gas containing fluorocarbon and a gas containing oxygen.

Figure 8:
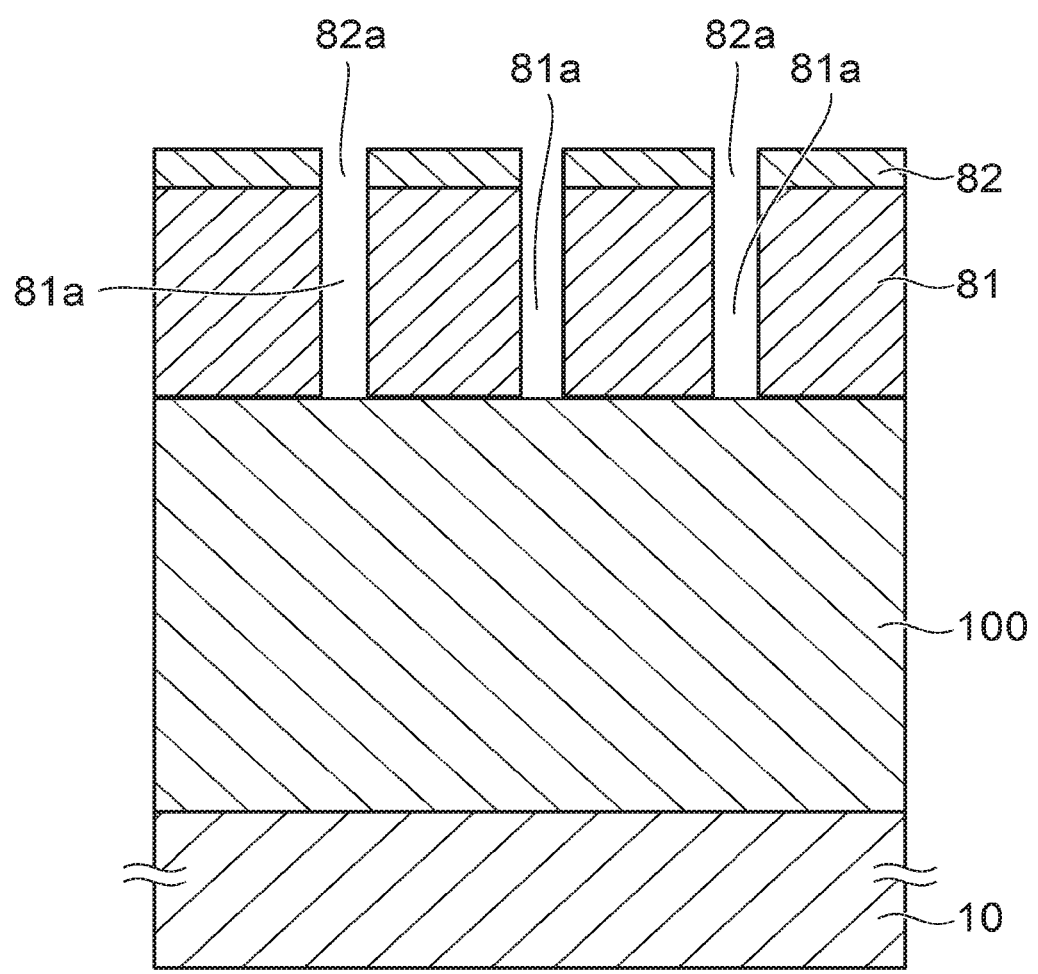

Further, as shown in FIG. 8, the mask layer 81 is patterned by RIE using the resist 83 and the first intermediate layer 82 as masks. Multiple holes 81a are formed in the mask layer 81. For example, a gas containing fluorine is used as an etching gas at this time. The resist 83 may be disappeared in the etching of the mask layer 81.

Figure 9:
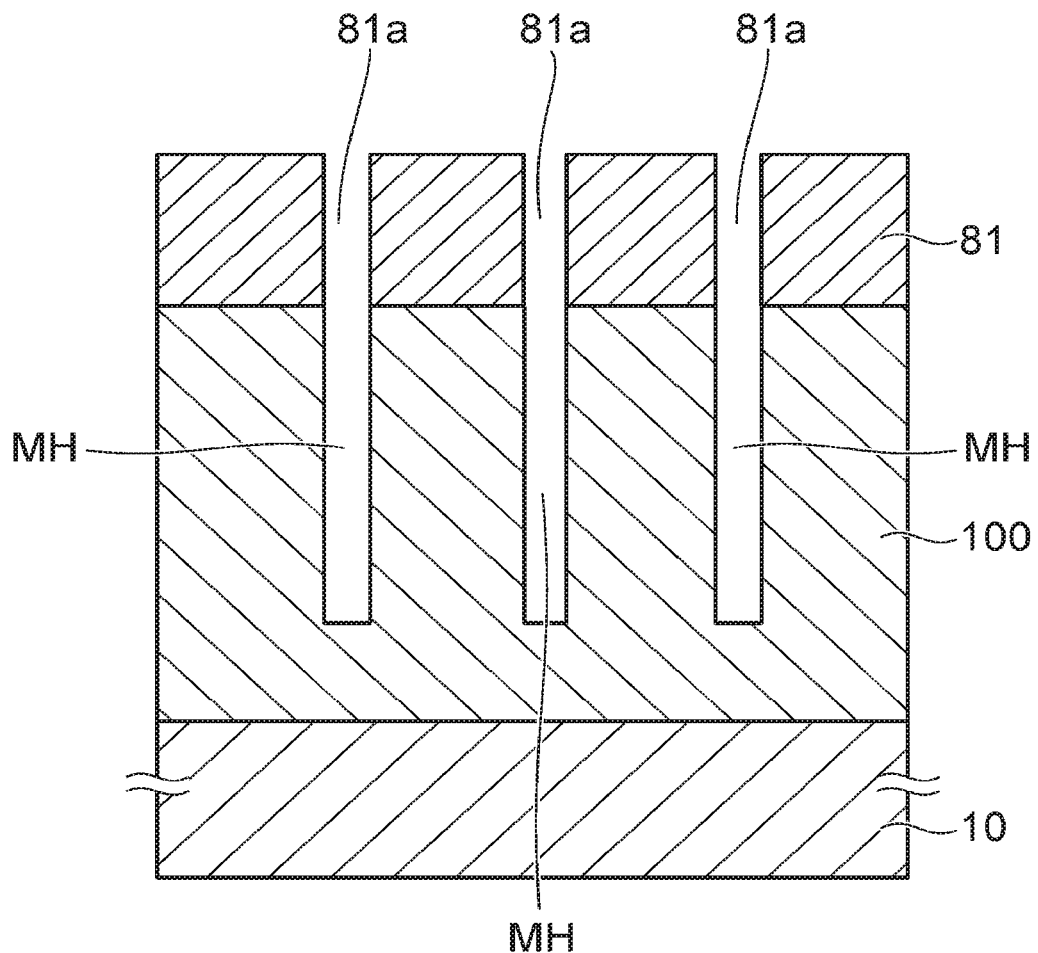

Then, as shown in FIG. 9, the stacked body 100 is patterned by RIE using the mask layer 81 as a mask. Multiple memory holes MH are made in the stacked body 100.

The stacked body 100 is etched by RIE using a gas containing fluorine (for example, a gas containing fluorocarbon or hydrofluorocarbon). The sacrificial layer 42 and the insulating layer 40 are etched continuously using the same etching gas without changing gases for etching the sacrificial layer 42 and the insulating layer 40. The first intermediate layer 82 may be disappeared in the etching of the stacked body 100.

According to the embodiment, the mask layer 81 is used as an etching mask for etching the stacked body 100. The mask layer 81 contains tungsten, boron and carbon. And the composition ratio of tungsten is higher than the composition ratio of boron and the composition ratio of carbon A shoulder dropping (taper) at an opening end of the hole 81a hardly occurs in the etching of the stacked body 100 using such a mask layer 81.

Table 1 shows measurement results of etching rates of an argon ion with respect to films of various materials.

|  | W | B | C | WB | WC | BC | WBC (W main) | WBC (B main) | WBC (C main) |
|---|---|---|---|---|---|---|---|---|---|
| 0° etching rate | 0.52 | 0.35 | 0.16 | 0.65 | 0.74 | 0.15 | 0.36 | 0.39 | 0.05 |
| 45° etching rate | 0.48 | 0.74 | 0.75 | 0.97 | 1.04 | 0.69 | 0.37 | 1.35 | 1.21 |

[nm/min.]

A 0°-etching rate and a 45°-etching rate were measured with respect to each of a W film, a B film, a C film, a WB film, a WC film, a BC film, a WBC film containing W as a main component, a WBC film containing B as a main component, and a WBC film containing C as a main component.

The W film is a single layer film of tungsten. The B film is a single layer film of boron. The C film is a single layer film of carbon. The WB film contains tungsten boride as a main component and does not substantially contain carbon. The WC film contains tungsten carbide as a main component and does not substantially contain boron. The BC film contains boron carbide as a main component and does not substantially contain tungsten. The WBC film containing W as a main component corresponds to the mask layer 81 of the embodiment described above, and is a film containing tungsten, boron and carbon in which the composition ratio of tungsten is higher than the composition ratio of boron and the composition ratio of carbon. The WBC film containing B as a main component is a film containing tungsten, boron and carbon in which the composition ratio of boron is higher than the composition ratio of tungsten and the composition ratio of carbon. The WBC film containing C as a main component is a film containing tungsten, boron and carbon in which the composition ratio of carbon is higher than the composition ratio of tungsten and the composition ratio of boron.

The 0°-etching rate shows a measurement result of the etching rate when the argon ion enters perpendicularly to surfaces of the films. The 45°-etching rate shows a measurement result of the etching rate when the argon ion enters from a direction inclined by 45 degree (45 degree direction) from a direction perpendicular to the surfaces of the films (0 degree direction).

In RIE, the etching rate depends on the incident direction (angle) of an ion. For example, the etching by the ion entering from the 45 degree direction tends to show a higher etching rate than the etching by the ion entering perpendicularly, and easily causes the shoulder dropping (taper) in the mask layer as shown in FIG. 21. Accordingly, the mask layer having a high etching resistance to the ion entering from 45 degree direction is effective for suppressing the shoulder dropping (taper) in the mask layer and the degradation of the hole configuration caused by the shoulder dropping.

The measurement results in Table 1 show that the etching rate of the WBC film containing W as a main component is the lowest among the measurement results of the 45°-etching rate.

This means that the shoulder dropping (taper) in the mask layer 81 can be suppressed by using the mask layer 81 that contains tungsten, born, and carbon, and in which the composition ratio of tungsten is higher than the composition ratio of boron and the composition ratio of carbon.

Therefore, according to the embodiment, such as plugging the hole 81a can be suppressed; the etching of the stacked body 100 in the substantially perpendicular direction to the major surface of the substrate 10 can progress. And it is easy to make the memory hole MH in which the fluctuation of the diameter in the depth direction is suppressed and a side wall has a straight configuration. The memory hole MH having an appropriate configuration can suppress, for example, the fluctuation in the characteristics of the memory cell in the stacking direction.

Also, the single layer film of tungsten (W film) is easily crystallized. The crystallized film has many crystal grain boundaries. In case where such a W film is used as the mask layer 81, there may be a possibility that the etching progresses along the crystal grain boundary and that fluctuation of the etching occurs due to the differences of the etching rate that depends on the direction of crystal. Therefore, micro unevenness that reflects the crystal grain boundary configuration is easily occurs in the side surface of the hole 81a. This may disturb to realize a fine patterning.

The mask layer 81 of the embodiment described above is substantially amorphous. Here, substantially amorphous layer is a layer of non-crystalline or micro-crystalline in which crystal grain size is less than 100 nm. Also, substantially amorphous layer may be a layer in which a broad diffraction intensity, or, halo peak can be observed in a diffraction measurement represented by an electron beam diffraction such as RHEED (Reflection High Energy Electron Diffraction), or an X-Ray diffraction, or a layer in which diffraction ray from intermetallic compound micro-crystalline due to imperfection of amorphous can be occurred. Further, the mask layer 81 may not be amorphous in it entirely, and the mask layer 81 may have a structure in which part of the crystalline thin film is amorphized.

The mask layer 81 is formed by CVD in a state that a wafer is heated; the temperature of the wafer at that time is 1000° C. or less, and the mask layer 81 is not substantially crystallized at that temperature. After the film formation, the film may be reformed by performing general heat and electromagnetic wave process such as furnace annealing, RTA (rapid thermal anneal), FLA (flash lamp anneal), microwaves annealing, UV (ultraviolet) radiation, EB (electron beam) radiation to the mask layer 81.

The mask layer 81 can be formed by sputtering method. The CVD having film forming speed faster than sputtering method is excellent in mass productivity as a method for forming the mask layer 81.

Tungsten that is a metal contained as a main component in the mask layer 81 belongs to a group having a lower sputtering rate due to ion among metals commonly used in semiconductor process. From the same view point, in addition to tungsten, tantalum, zirconium, hafnium, molybdenum, niobium, ruthenium, osmium, rhenium, or iridium can be a metal contained as a main component in the mask layer 81.

In other words, the mask layer 81 contains boron, carbon and at least one type of metal selected from a group including tungsten, tantalum, zirconium, hafnium, molybdenum, niobium, ruthenium, osmium, rhenium, and iridium. Also, the composition ratio of the metal is higher than the composition ratio of boron and the composition ratio of carbon in the mask layer 81.

The mask layer 81 containing the above metal other than tungsten with higher in composition ratio than boron and carbon shows the same result as shown in Table 1. In other words, the mask layer 81 that contains boron, carbon and at least one type of metal selected from a group including tungsten, tantalum, zirconium, hafnium, molybdenum, niobium, ruthenium, osmium, rhenium, and iridium, and the composition ratio of the metal is higher than the composition ratio of boron and the composition ratio of carbon has low 45° etching rate so that shoulder dropping is hardly occurs.

Tungsten, tantalum, zirconium, hafnium, molybdenum, and niobium are desirable among these metals, due to experiences applying to the semiconductor process, and low possibility of fatal contamination risk.

Among them, in particular, tungsten is used for the conductive layer (control electrode) 70 and the conductive material LI in the memory cell MC due to low resistance and high melting point. Therefore, process control and management become easier and mass productivity is expected to be improved by selecting tungsten as a metal contained in the mask layer 81 similarly.

If elements due to the source gas used at CVD for forming the mask layer 81 are contained in the mask layer 81 other than those metals, boron, and carbon, the elements may be trace amount and do not affect to the characteristics of the mask layer 81.

In case where consumption amount of resist 83 is large with respect to etching gas used for patterning the mask layer 81, it may be considered to increase film thickness of the resist 83. However, increasing the thickness of the resist 83 is limited by a resolution limit of lithography. Therefore, as shown in the embodiment above, it is desirable that the first intermediate layer 82 is formed between the mask layer 81 and the resist 83, and the first intermediate layer 82 is used for the process mask for mask layer 82.

Figure 20:
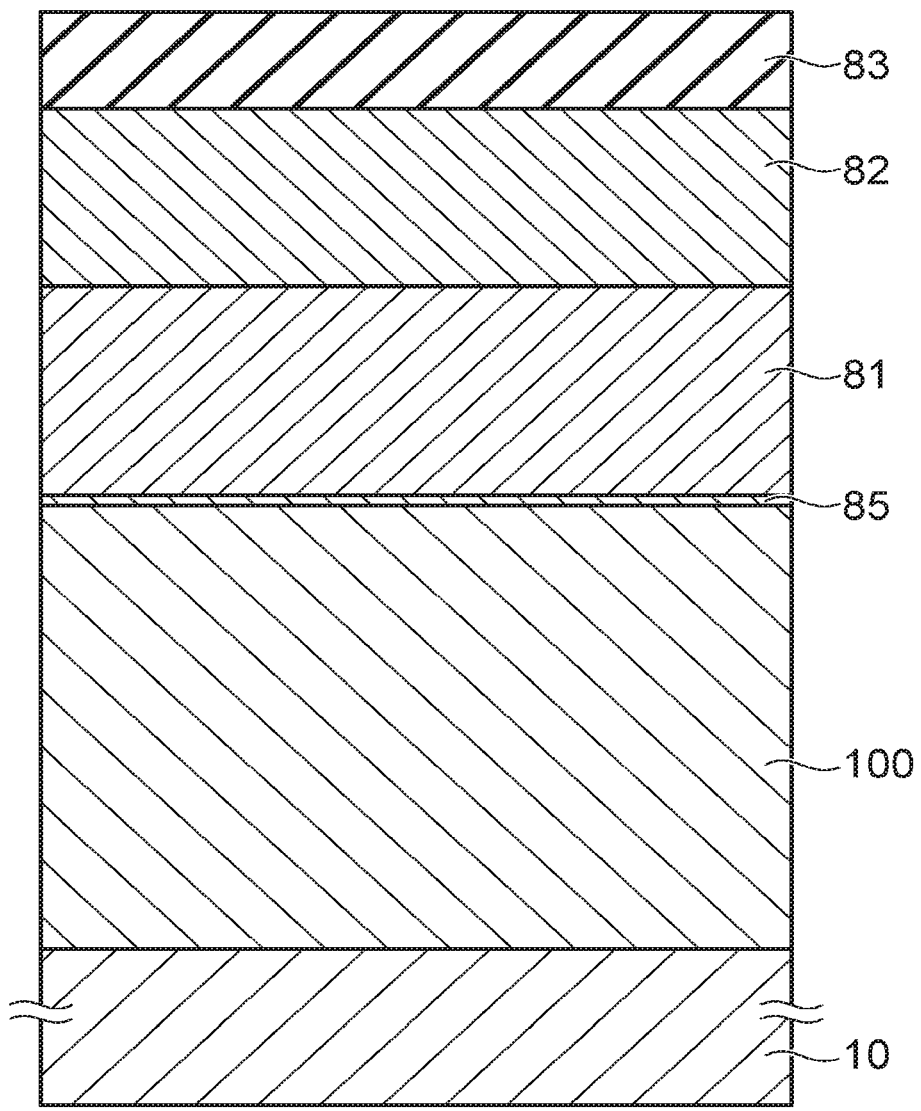

Also, as shown in FIG. 20, by forming a film 85 containing metal nitride between the stacked body 100 and the mask layer 81, adhesion between the stacked body 100 and the mask layer 81 can be increased. A nitride film of the same metal (for example, tungsten) as the metal (for example, tungsten) contained in the mask layer 81 can be used for the film 85.

Or, adhesion between the mask layer 81 and the stacked body 100 can be increased by further containing nitrogen in the mask layer 81 itself.

Or, the insulating layer 40 of the stacked body 100 is a silicon oxide film and the sacrificial layer 41 is a silicon nitride film; both are chemical compounds containing silicon. Therefore, adhesion between the mask layer 81 and the stacked body 100 can be increased by further containing silicon in the mask layer 81.

Figure 18:
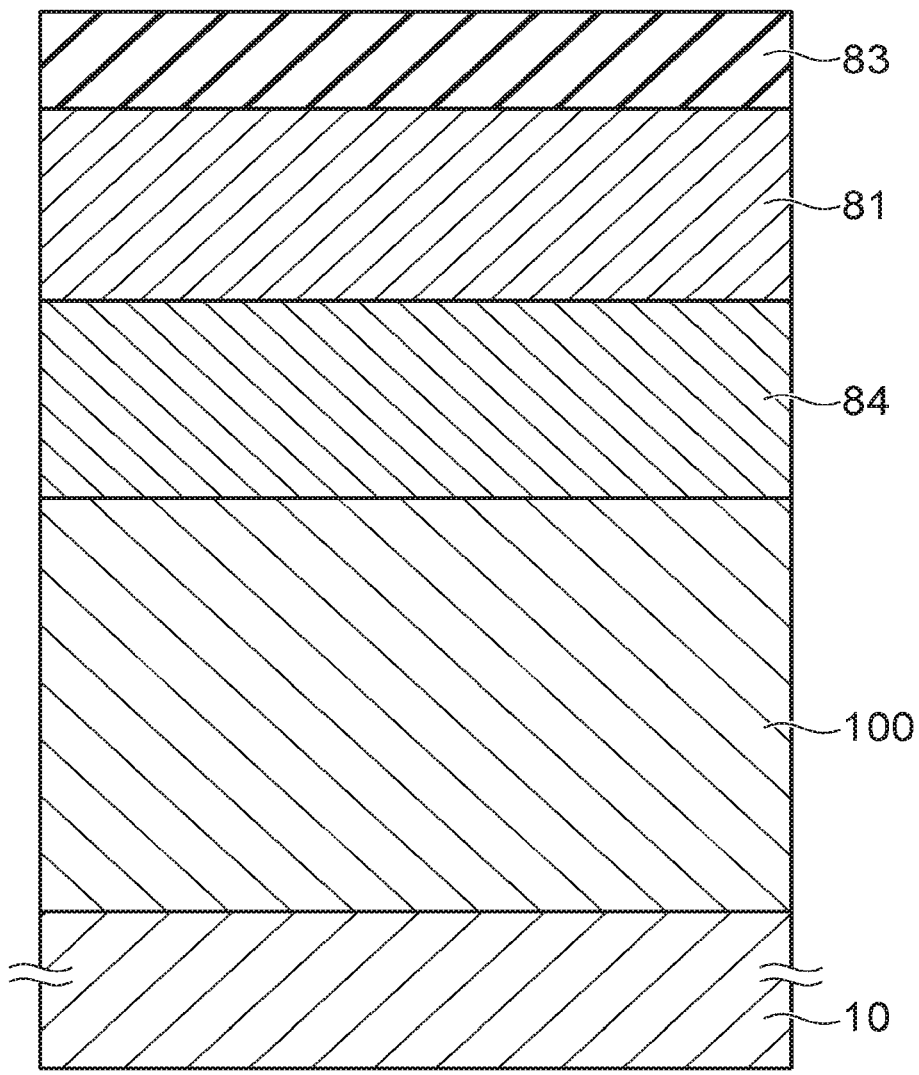

As shown in FIG. 18, a second intermediate layer 84 can be formed between the stacked body 100 and the mask layer 81.

The second intermediate layer 84 is a layer of a material different from the stacked body 100 (the insulating layer 40 and the sacrificial layer 41) and the mask layer 81. The second intermediate layer 84 is, for example, an amorphous carbon layer containing amorphous carbon as a main component, a boron carbide layer containing boron carbide (BC) as a main component, a boron nitride layer containing boron nitride (BN) as a main component, or an amorphous silicon layer containing amorphous silicon as a main component. The second intermediate layer 84 is formed, for example, by plasma CVD.

The second intermediate layer 84 functions as a mask for processing the stacked body 100 in case where the mask layer 81 does not have an enough thickness as an etching mask for etching the stacked body 100. In case where there is a possibility of increasing film stress due to increasing the film thickness of the mask layer 81 containing metal, there may be a possibility that it is difficult to increase the film thickness of the mask layer 81. The second intermediate layer 84 not containing the metal can compensate insufficiency of the thickness of the mask layer 81 as a mask for processing the stacked body 100 without increasing the film thickness of the mask layer 81 itself.

Also, if the second intermediate layer 84 formed between the stacked body 100 and the mask layer 81 can be easily peeled off from the stacked body 100, the mask layer 81 on the second intermediate layer 84 may be lifted off and can be easily removed from a surface of the stacked body 100.

Figure 19:
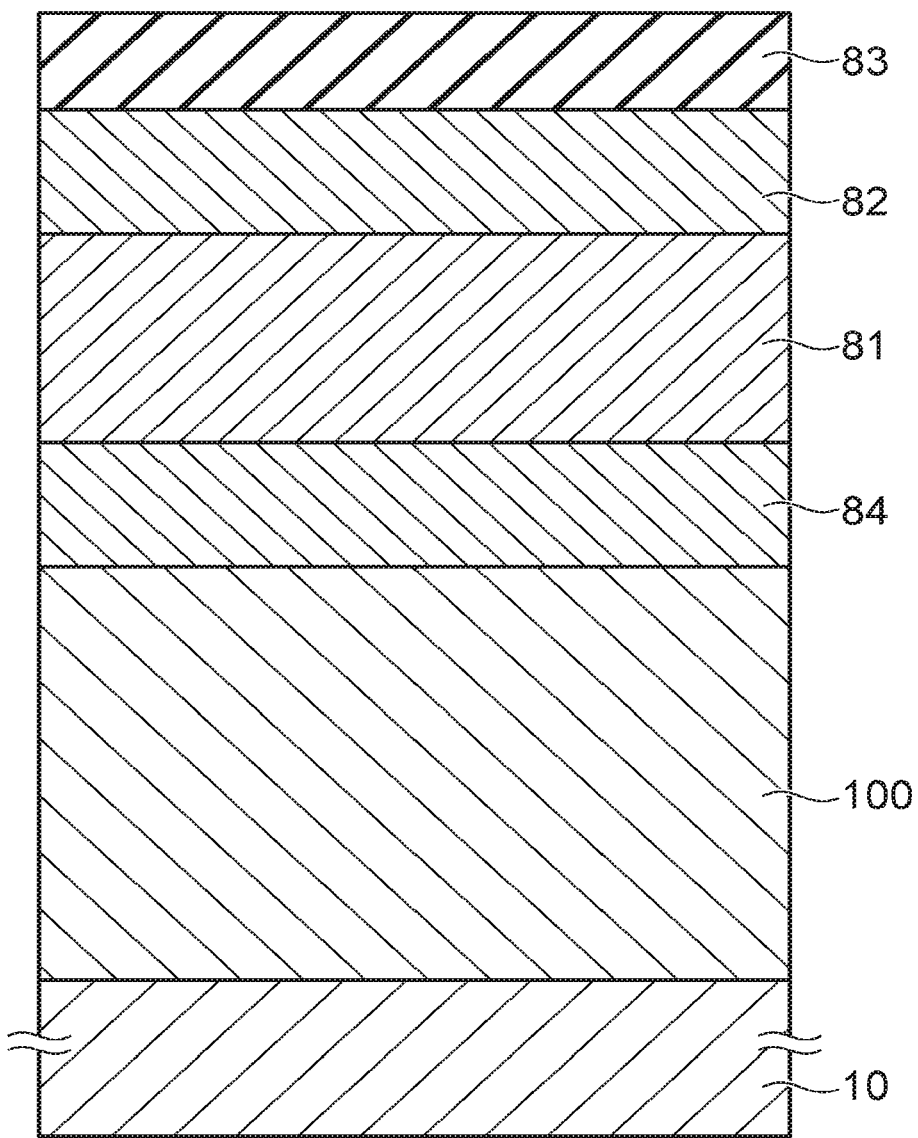

As shown in FIG. 19, the second intermediate layer 84 is formed between the stacked body 100 and the mask layer 81, and also, the first intermediate layer 82 is formed between the mask layer 81 and the resist 83.

Figure 10:
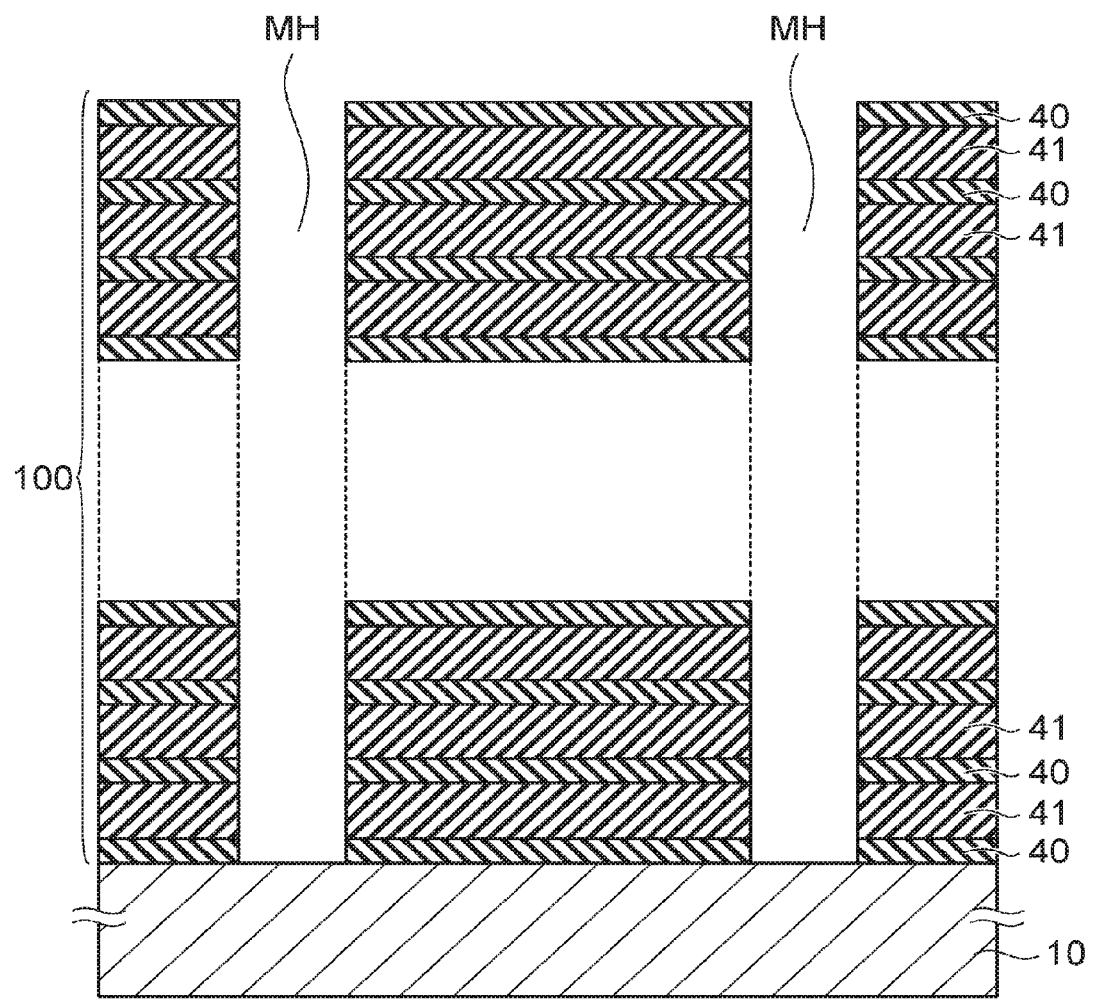

As shown in FIG. 10, multiple memory holes MH are made in the stacked body 100 by dry etching (RIE) using the mask layer 81 described above. The memory hole MH extends in the stacking direction of the stacked body 100 (the Z-direction), pierces the stacked body 100 and reaches the substrate 10.

Figure 11:
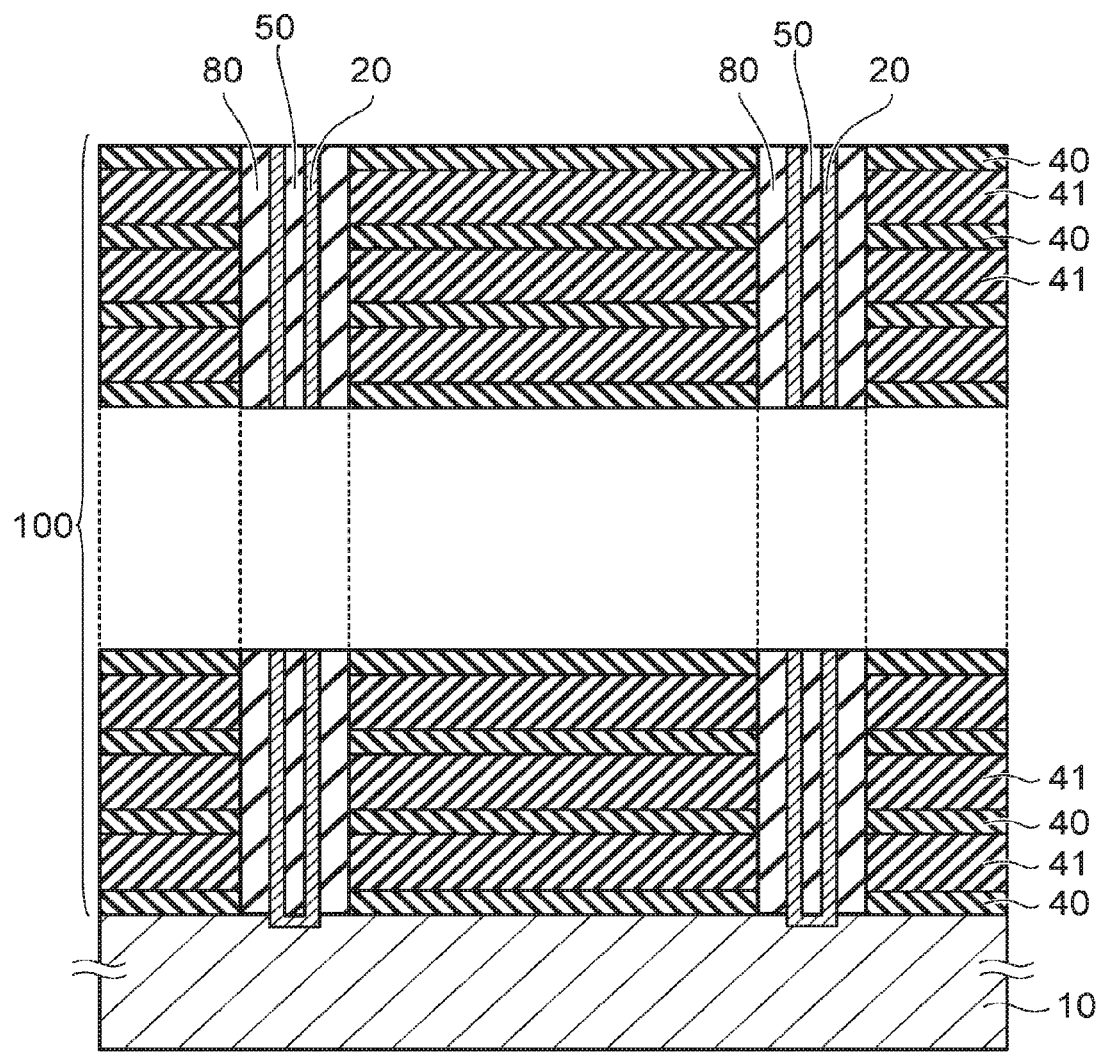
Figure 12:
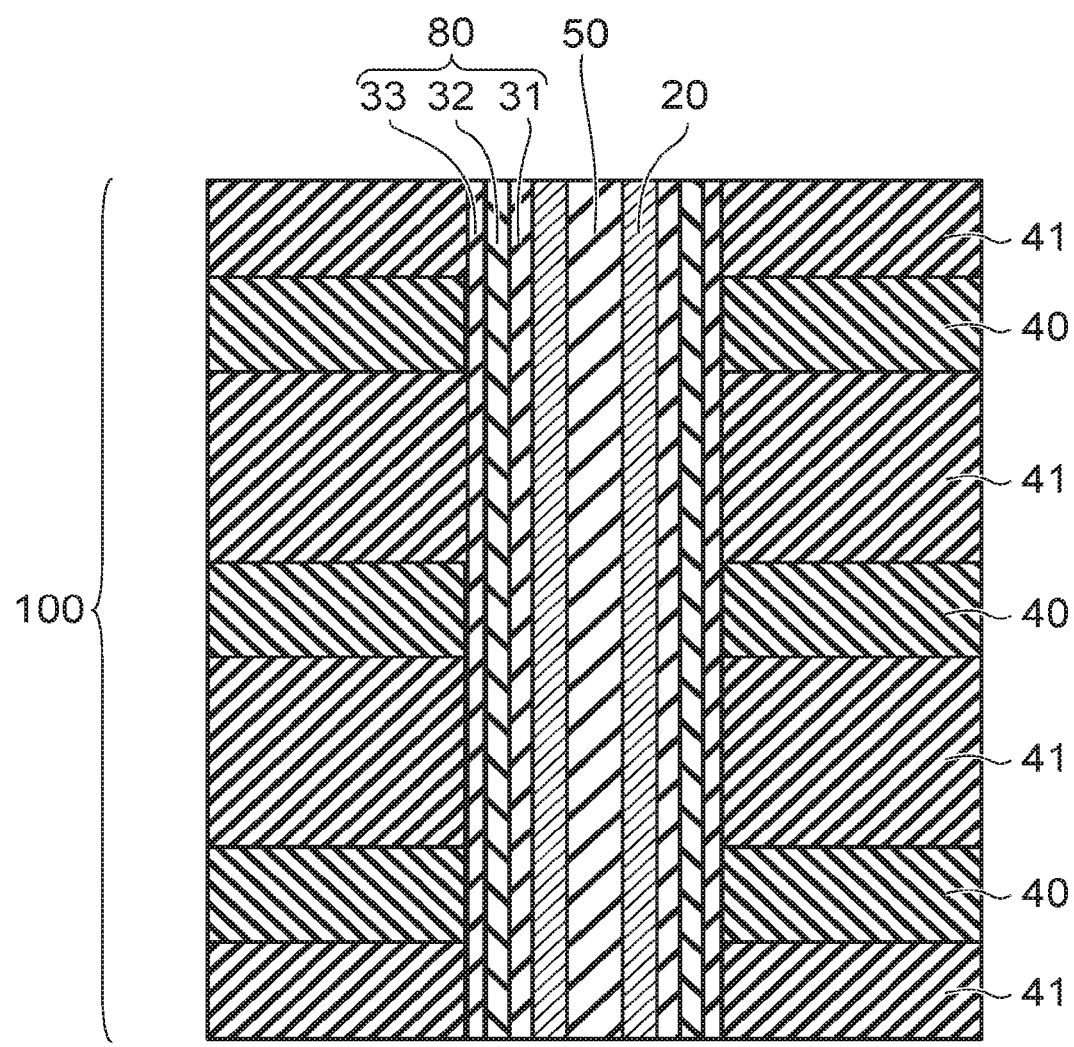

As shown in FIG. 11 and FIG. 12 that shows an enlarged view of one portion of FIG. 11, a stacked film 80, the semiconductor film 20, and the core film 50 are formed inside the memory hole MH. As shown in FIG. 12, the stacked film 80 includes the cover insulating film 33, the charge storage film 32, and the tunneling insulating film 31.

First, for example, a silicon oxide film ($SiO_2$ film) is formed on the side surface of the memory hole MH as the cover insulating film 33 by ALD (Atomic Layer Deposition). The cover insulating film 33 is also formed on a bottom of the memory hole MH.

For example, a silicon nitride film (SiN film) is formed on the inner side of the cover insulating film 33 as the charge storage film 32 by ALD. The charge storage film 32 may be a film which can trap charge, and for example, hafnium oxide film (HfOxfilm), aluminum oxide film (AlOxfilm), or aluminum nitride film (AlNfilm) can be used for the charge storage film 32. Or, the charge storage film 32 may be a stacked film including at least two of a silicon nitride film, a hafnium oxide film, an aluminum oxide film, and an aluminum nitride film.

For example, a silicon oxide film ($SiO_2$ film) is formed on the inner side of the charge storage film 32 as tunneling insulating film 31 by ALD.

Cavity remains on the inner side of the stacked film 80, and a portion of the stacked film 80 deposited on the bottom of the memory hole MH below the cavity is removed, for example, by RIE. Then, the semiconductor film 20 is formed on the side surface of the tunneling insulating film 31.

As shown in FIG. 11, the semiconductor film 20 is also formed on the bottom of the memory hole MH and contacts to the substrate 10. For example, a silicon film is formed as the semiconductor film 20 by CVD.

Cavity remains on the inner side of the semiconductor film 20, and for example, a silicon oxide film ($SiO_2$ film) is buried in the cavity as the core film 50.

Figure 13:
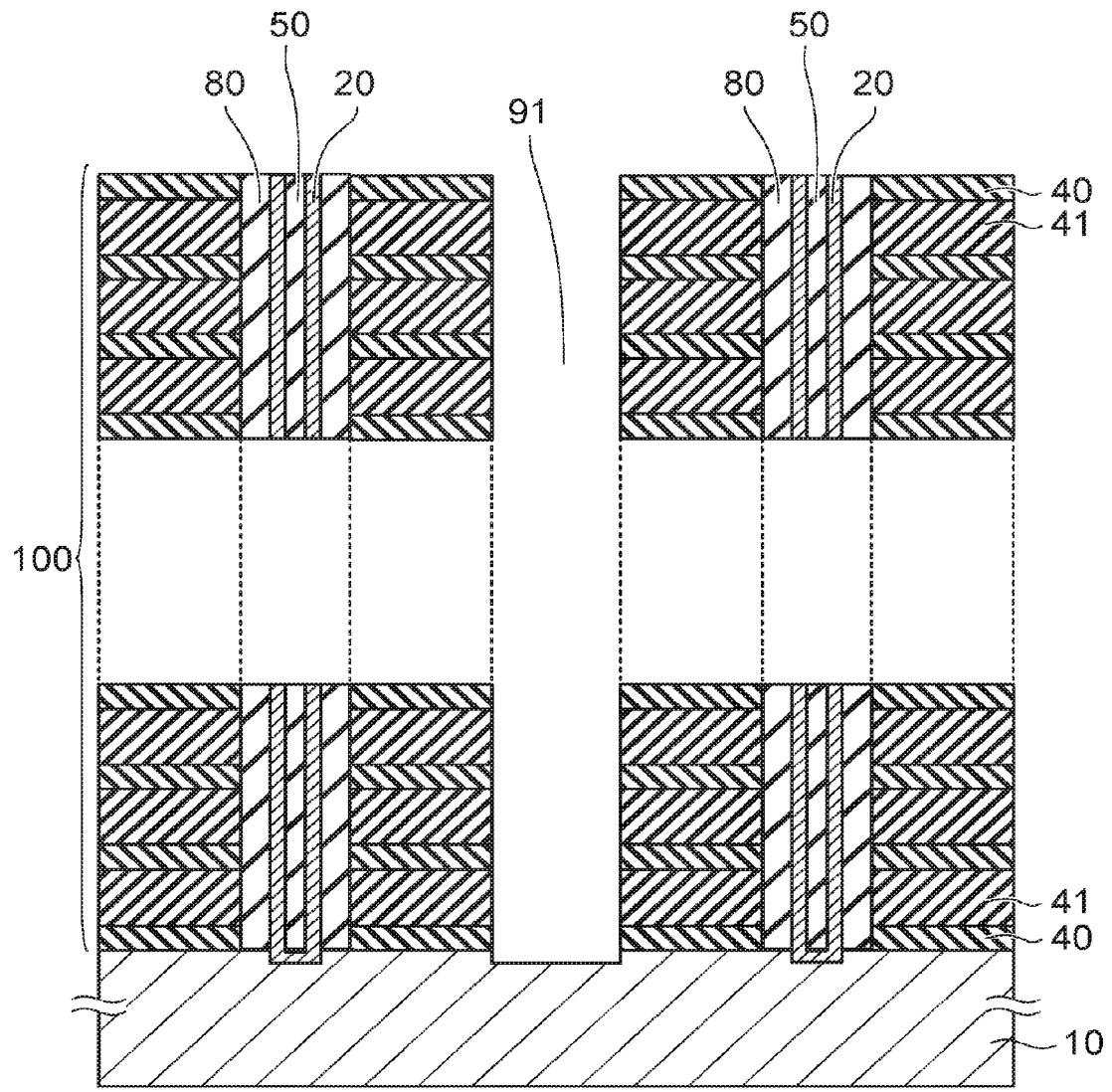

Then, as shown in FIG. 13, a slit 91 is made in the stacked body 100. The slit 91 is also made by the similar RIE using the similar mask layer 81 used for making the memory hole MH. The slit can be formed in the stacked body 100 by the RIE using the mask layer 81 having not a hole but a slit. Also at this time, the shoulder dropping in the mask layer 81 can be suppressed.

The slit 91 extends in the stacking direction of the stacked body 100 (the Z-direction), pierces the stacked body 100 and reaches the substrate 10. Also, the slit 91 extends into the page surface (the X-direction) and divides the stacked body 100 in the Y-direction.

Figure 14:
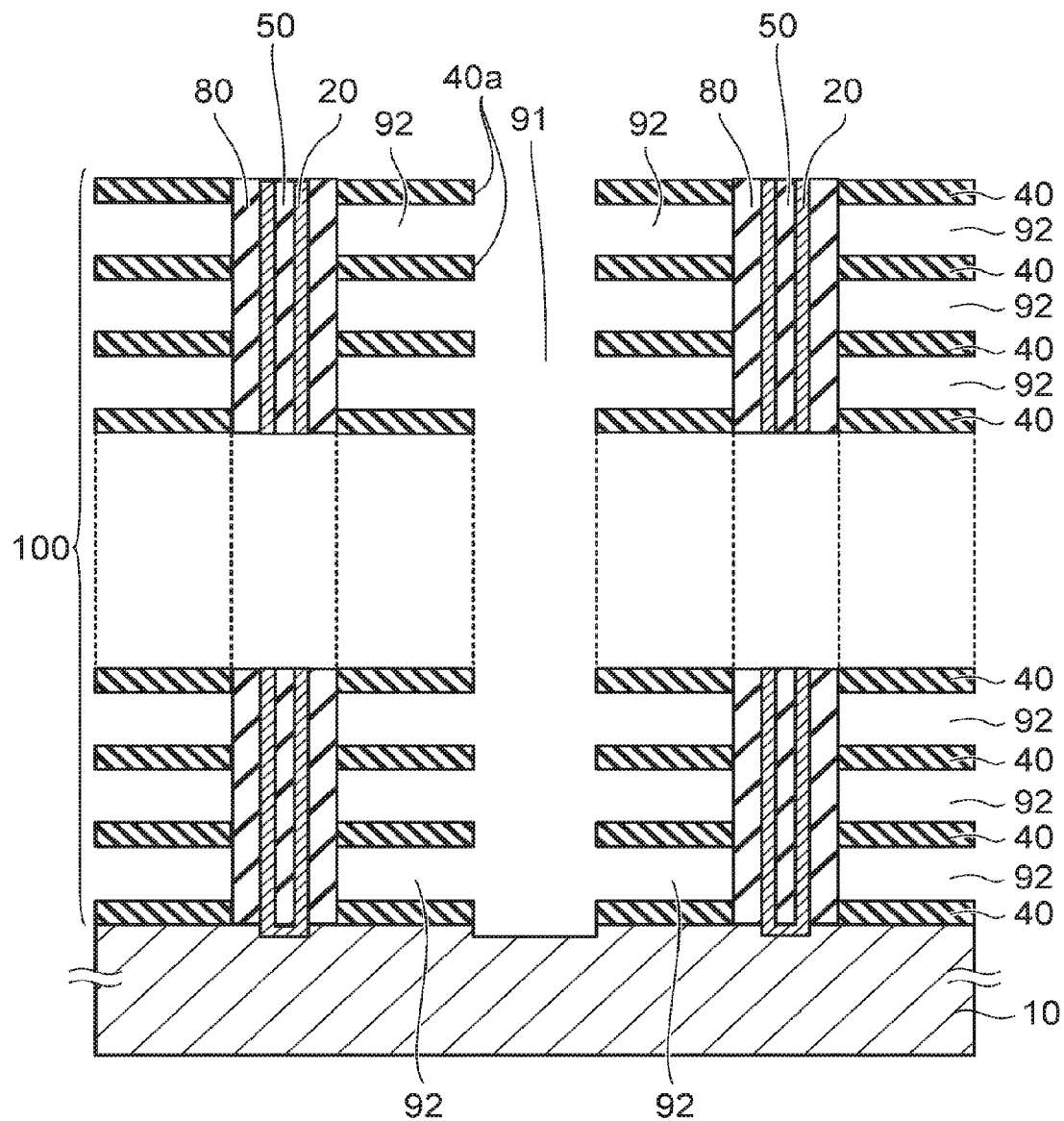

Then, the sacrificial layer 41 is removed by wet etching using, for example, a hot phosphoric acid supplied through the slit 91. As shown in FIG. 14, a gap (or a space) 92 is made between the insulating layers 40 by the removal of the sacrificial layer 41. The cover insulating film 33 protects the charge storage film 32 during the etching.

Figure 15:
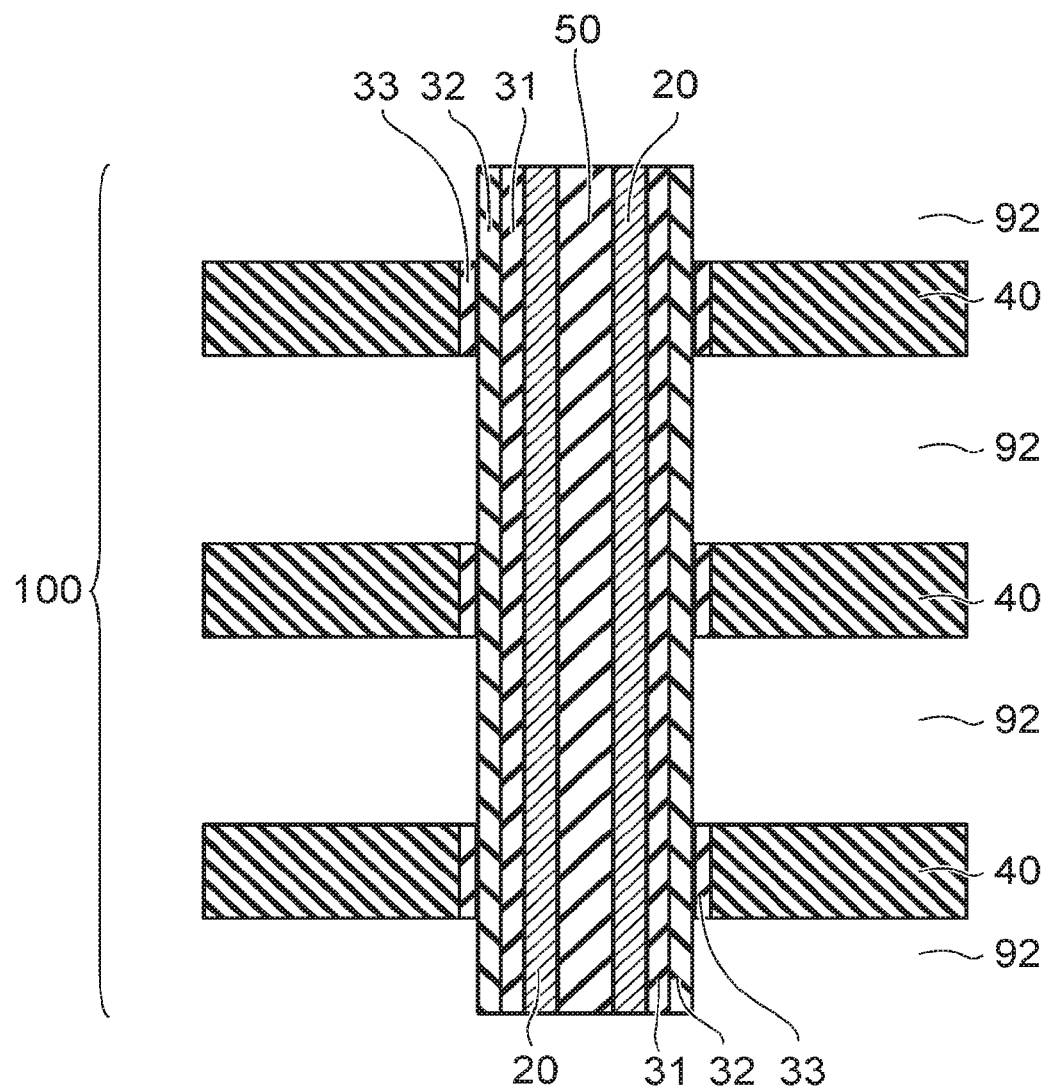

Further, a portion of the cover insulating film 33 is also removed by the wet etching. The cover insulating film 33 facing the gap 92 is removed as shown in the enlarged view of FIG. 15, and the charge storage film 32 is exposed in the gap 92.

By controlling the etching rate for removing the cover insulating film 33 lower than the etching rate for removing the sacrificial layer 41, etching damage to the charge storage film 32 can be suppressed.

Figure 16:
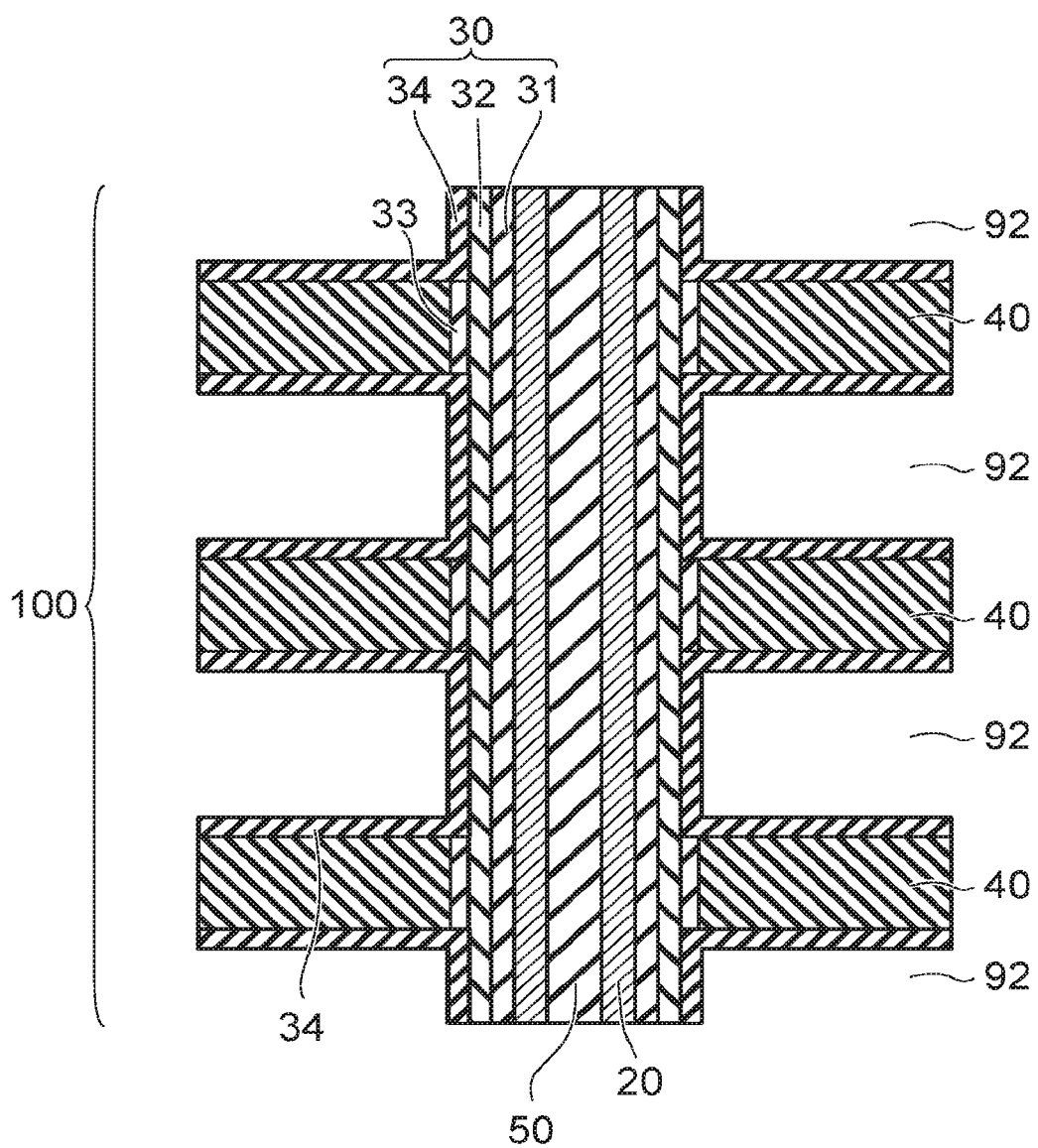

Then, the blocking insulating film 34 is formed on an inner wall of the gap 92 as shown in FIG. 16. For example, the silicon oxide film (SiO₂ film) is formed as the blocking insulating film 34 by ALD. Or, the blocking insulating film 34 may be a stacked film of a silicon oxide film and a silicon nitride film. Or, the blocking insulating film 34 may be a high-k film such as an aluminum oxide film (AlOx film), a hafnium oxide film (HfOx film), a lanthanum aluminum oxide film (LaAlOx film). Further, the blocking insulating film 34 may be a stacked film of the high-k film recited above and a silicon oxide film. The high-k film recited above can be used for the tunneling insulating film 31.

The blocking insulating film 34 is formed conformally along the upper surface and lower surface of the insulating layer 40 and the charge storage film 32, exposed in the gap 92.

Figure 17:
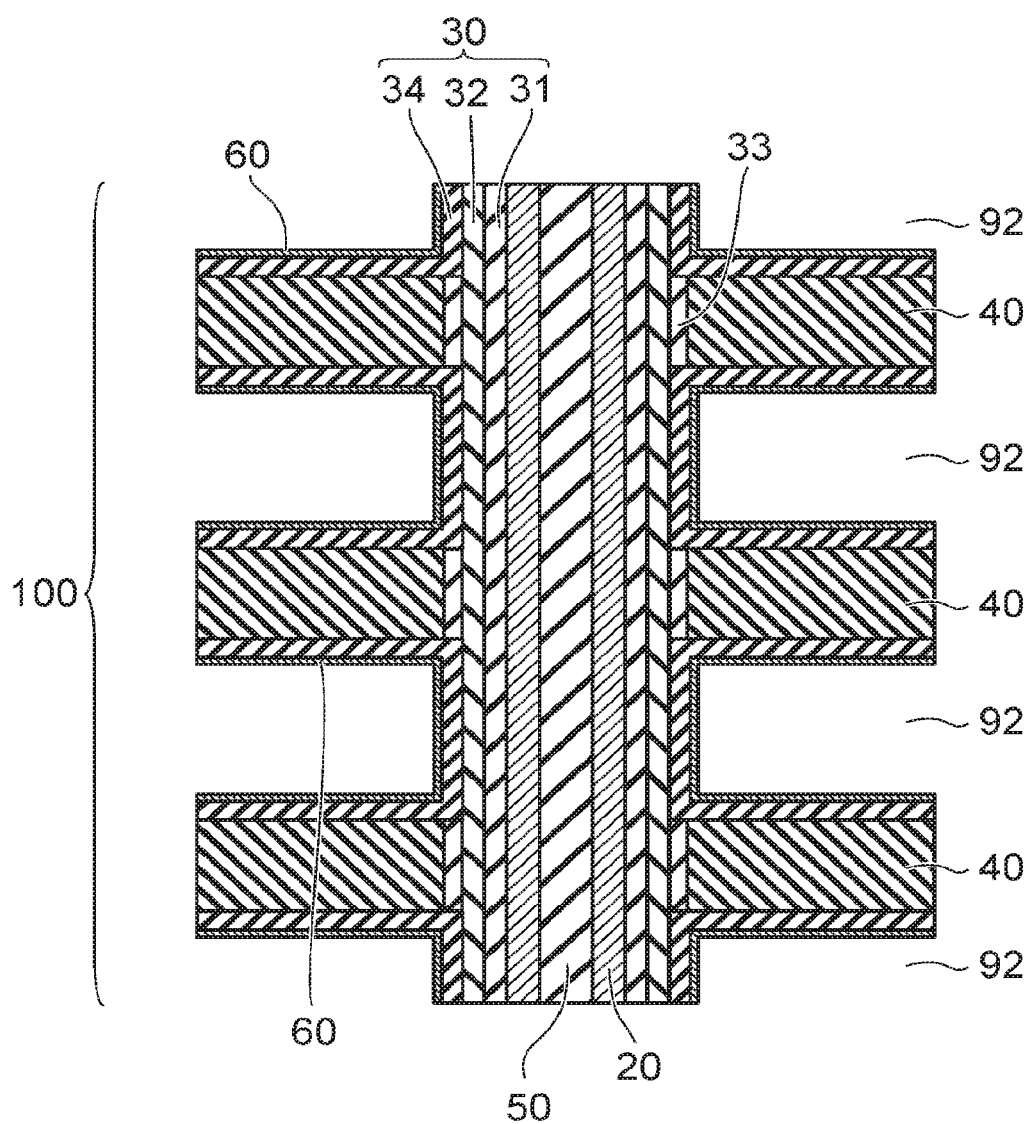

Then, as shown in FIG. 17, a titanium nitride film (TiN film) 60 is formed on the inner side of the blocking insulating film 34, for example, by CVD. The titanium nitride film 60 is formed conformally along the blocking insulating film 34.

The gap 92 remains on the inner side of the titanium nitride film 60. The conductive layer 70 is formed inside the gap 92 as shown in FIG. 3.

A tungsten layer is buried in the gap 92 as the conductive layer 70, for example, by CVD using tungsten fluoride (WF₆) gas. Or, a molybdenum layer is buried in the gap 92 as the conductive layer 70, for example, by CVD using molybdenum fluoride (WMo₆) gas.

By interposing the titanium nitride film 60 between the blocking insulating film 34 and the conductive layer 70, adhesion between the conductive layer 70 and the titanium nitride film 60 can be increased compared to a case where the conductive layer 70 is formed on the blocking insulating film 34 directly.

Also, the titanium nitride film 60 functions as a barrier layer for preventing the diffusion into the memory film 30 side of the metal (tungsten or molybdenum) contained in the conductive layer 70.

For example, a nitride film such as tantalum nitride film (TaN film), tantalum aluminum nitride film (TaAlN film), titanium silicon nitride film (TiSiN film) or the like other than the titanium nitride film can be interposed between the blocking insulating film 34 and the conductive layer 70.

The source gas for the conductive layer 70 enters the gap 92 through the slit 91 shown in FIG. 14. At that time, a material film (a metal film) of the conductive layer 70 is deposited on the side surface 40a of the insulating layer 40 exposed in the slit 91. Then, the metal film on the side surface 40a of the insulating layer 40 is removed, and a short through the metal film between the conductive layers 70 of different layers can be blocked.

The titanium nitride film 60 formed conformally along the inner wall of the gap 92 before forming the conductive layer 70 is also formed on the side surface 40a of the insulating layer 40, and the titanium nitride films 60 of the different layers continue via a portion of the titanium nitride film 60 formed on the side surface 40a of the insulating layer 40. Because the conductive layer 70 formed after forming the titanium nitride film 60 contacts the titanium nitride film 60, between the conductive layers 70 of the different layers are shorted through the titanium nitride film 60 that is conductive. Therefore, the titanium nitride film 60 formed on the side surface 40a of the insulating layer 40 is also removed so as to divide the connection of the titanium nitride films 60 in the vertical direction (the stacking direction). Thereby, the short between the conductive layers 70 of the different layers through the titanium nitride film 60 are blocked.

Then, the conductive material LI is formed inside the slit 91 with the insulating film 42 interposed. The insulating film 42 is formed conformally on a side surface and a bottom of the slit 91. The insulating film 42 at the bottom of the slit 91 is removed, for example, by RIE, and the substrate 10 is exposed at the bottom of the slit 91. Then, the conductive material LI is formed on the inner side of the insulating film 42 in the slit 91, and the lower end of the conductive material LI contacts the substrate 10. Further, subsequently, the bit lines BL and the source line SL shown in FIG. 1 and the like are formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
    forming a mask layer on a layer to be etched, the mask layer containing at least one type of a metal, boron, and carbon, the metal being selected from a group including tungsten, tantalum, zirconium, hafnium, molybdenum, niobium, ruthenium, osmium, rhenium and iridium, a composition ratio of the metal being higher than a composition ratio of the boron and a composition ratio of the carbon;
    patterning the mask layer; and
    performing a dry etching to the layer to be etched using the mask layer being patterned.

2. The method for manufacturing the semiconductor device according to claim 1, wherein the mask layer further contains nitrogen.

3. The method for manufacturing the semiconductor device according to claim 1, wherein the mask layer further contains silicon.

4. The method for manufacturing the semiconductor device according to claim 1, wherein
    the layer to be etched contains silicon,
    the layer to be etched is etched using a gas containing fluorine.

5. The method for manufacturing the semiconductor device according to claim 1, wherein
    the layer to be etched is a stacked body including a plurality of first layers and a plurality of second layers, the first layers and the second layers including a first layer and a second layer stacked repeatedly, the second layers being layers of a different type of material from the first layers.

6. The method for manufacturing the semiconductor device according to claim 5, wherein the first layer includes a silicon nitride film, and the second layer includes a silicon oxide film.

7. The method for manufacturing the semiconductor device according to claim 5, wherein the layer to be etched is performing the dry etching for making a hole or a slit in the layer to be etched.

8. The method for manufacturing the semiconductor device according to claim 7, further comprising:
   removing the first layers by etching through the hole or the slit, and making gaps between the second layers; and
   forming conductive layers in the gaps.

9. The method for manufacturing the semiconductor device according to claim 1, further comprising:
   forming a film containing a metal nitride, the film being provided between the layer to be etched and the mask layer.

10. The method for manufacturing the semiconductor device according to claim 9, further comprising:
    forming a first intermediate layer on the mask layer, the first intermediate layer being of a different type of material from the mask layer,
    wherein the mask layer is patterned by etching using the first intermediate layer as a mask.

11. The method for manufacturing the semiconductor device according to claim 1, further comprising:
    forming a first intermediate layer on the mask layer, the first intermediate layer being of a different type of material from the mask layer,
    wherein the mask layer is patterned by etching using the first intermediate layer as a mask.

12. The method for manufacturing the semiconductor device according to claim 1, further comprising:
    forming a second intermediate layer between the layer to be etched and the mask layer, the second intermediate layer being of a different type of material from the layer to be etched and the mask layer.

13. The method for manufacturing the semiconductor device according to claim 11, further comprising:
    forming a second intermediate layer between the layer to be etched and the mask layer, the second intermediate layer being of a different type of material from the layer to be etched and the mask layer.

14. The method for manufacturing the semiconductor device according to claim 11, wherein the first intermediate layer contains carbon, boron carbide, boron nitride, silicon oxide, silicon nitride, or amorphous silicon as a main component.

15. The method for manufacturing the semiconductor device according to claim 12, wherein the second intermediate layer contains carbon, boron carbide, boron nitride, or amorphous silicon as a main component.

16. The method for manufacturing the semiconductor device according to claim 1, wherein the mask layer is formed by chemical vapor deposition (CVD).

17. The method for manufacturing the semiconductor device according to claim 1, wherein the mask layer is substantially amorphous.

* * * * *